US012068222B2

(12) United States Patent
Modi et al.

(10) Patent No.: US 12,068,222 B2
(45) Date of Patent: Aug. 20, 2024

(54) DUMMY DIE STRUCTURES OF A PACKAGED INTEGRATED CIRCUIT DEVICE

(71) Applicant: Intel Corporation, Santa Clara, CA (US)

(72) Inventors: Mitul Modi, Phoenix, AZ (US); Joseph Van Nausdle, Chandler, AZ (US); Omkar Karhade, Chandler, AZ (US); Edvin Cetegen, Chandler, AZ (US); Nicholas Haehn, Scottsdale, AZ (US); Vaibhav Agrawal, Chandler, AZ (US); Digvijay Raorane, Chandler, AZ (US); Dingying Xu, Chandler, AZ (US); Ziyin Lin, Chandler, AZ (US); Yiqun Bai, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 815 days.

(21) Appl. No.: 17/032,577

(22) Filed: Sep. 25, 2020

(65) Prior Publication Data
US 2022/0102242 A1 Mar. 31, 2022

(51) Int. Cl.
*H01L 23/42* (2006.01)
*H01L 21/48* (2006.01)
*H01L 23/31* (2006.01)

(52) U.S. Cl.
CPC ............ *H01L 23/42* (2013.01); *H01L 21/481* (2013.01); *H01L 23/3128* (2013.01)

(58) Field of Classification Search
None
See application file for complete search history.

(56) References Cited

U.S. PATENT DOCUMENTS

| 6,020,750 A * | 2/2000 | Berger | G01R 31/2886 324/762.05 |
| 2004/0188859 A1 * | 9/2004 | He | C08K 3/22 425/129.1 |
| 2004/0248337 A1 * | 12/2004 | Yan | C08K 3/40 257/432 |
| 2015/0021754 A1 * | 1/2015 | Lin | H01L 23/552 438/122 |

* cited by examiner

*Primary Examiner* — Evren Seven
*Assistant Examiner* — Cole Leon Lindsey
(74) *Attorney, Agent, or Firm* — Essential Patents Group, LLP

(57) ABSTRACT

Techniques and mechanisms for facilitating heat conductivity in a packaged device with a dummy die. In an embodiment, a packaged device comprises a substrate and one or more IC die coupled to a surface thereof. A dummy die, adjacent to an IC die and coupled to a region of the substrate, comprises a polymer resin and a filler. A package mold structure of the packaged device adjoins respective sides of the IC die and the dummy die, and adjoins the surface of the substrate. In another embodiment, a first CTE of the dummy die is less than a second CTE of the package mold structure, and a first thermal conductivity of the dummy die is greater than a second thermal conductivity of the package mold structure.

15 Claims, 17 Drawing Sheets

DUMMY DIE STRUCTURES OF A PACKAGED INTEGRATED CIRCUIT DEVICE

BACKGROUND

1. Technical Field

This disclosure generally relates to packaged circuit devices and more particularly, but not exclusively, to dummy die structures which facilitate heat conduction in a packaged circuit device.

2. Background Art

In conventional multi-chip modules (MCMs), by packing a number of semiconductor devices in close proximity to each other while eliminating the individual packages for each of the devices, the electrical performance is improved and the board space occupied by the devices is reduced. Due to an increase in the packing density, however, the power density of the multi-chip module is typically higher than when separately packaged devices requiring more elaborate thermal design and thermal management schemes in order to maintain the device temperature within acceptable ranges are used.

In conventional multi-chip modules, the devices are connected to a substrate and the electrical connection among the devices is accomplished within the substrate, which may also be an integral part of the MCM package. One of the technologies used to connect the devices to the substrate is called flip chip and control collapse chip connection (i.e., "C4"). With this technology, solder bumps are developed at the chip terminals. Subsequently, the devices are flipped over on the substrate and the solder bumps are reflowed to make connection to the terminal pads on the substrate. Internal thermal resistance and thermal performance of the MCM using flip chip and C4 interconnect technology are typically determined in part by the heat flow paths from the devices to the package body. Most of the heat generated by the devices flows out through one of the two primary heat flow paths in order to get to the package surface and eventually to a heat sink located on the package surface.

As successive generations of integrated circuit technologies continue to trend toward higher frequencies, smaller die size, and increased power, there is expected to be an increasing premium placed on solutions to improve how heat is conducted in and from packaged circuit devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
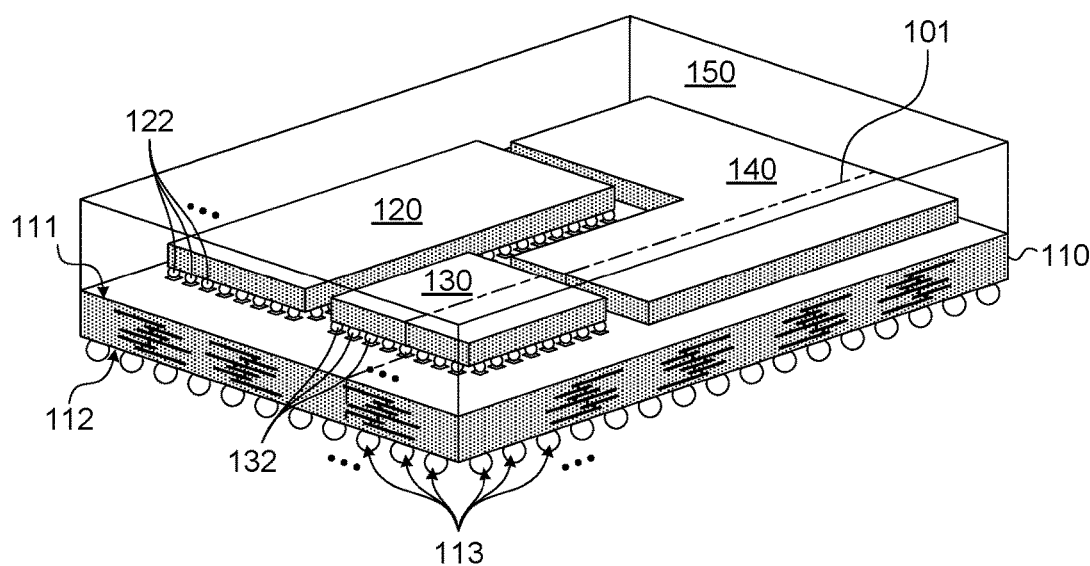
FIG. 1 illustrates a perspective view diagram showing features of a packaged device comprising a dummy die structure according to an embodiment.
Figure 1:
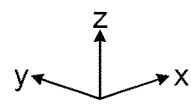

Embodiments discussed herein variously provide techniques and mechanisms for facilitating heat conductivity in a packaged device with a dummy die structure. As used herein, "dummy die" refers to any of a variety of structures which comprise a contiguous body of a material (or compound) other than silicon—e.g., where the structure omits active circuit components (e.g., transistors, diodes, etc.) or other circuitry. In an embodiment, a dummy die is to be coupled to a surface of a substrate, wherein a packaged device is to include the substrate and the dummy die. Such a dummy die spans a "vertical" range from the "horizontal" surface of the substrate to a first height over the surface—e.g., wherein, after completion of a packaging, at least some mold compound of the packaged device (including, for example, a material other than any material of the dummy die) extends into the vertical range. For example, in various embodiments, one or more regions of the substrate surface are in direct contact with the mold compound (and are not overlapped by the dummy die). In some embodiments, a mold compound surrounds a dummy die in a horizontal plane. Alternatively or in addition, a horizontal cross-section of a dummy die is substantially rectilinear, for example. In other embodiments, such a horizontal cross-section forms a main body portion and one or more lobes, branches and/or other extensions from that main body portion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a packaged integrated circuit device.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

FIG. 1 shows features of a packaged device 100 comprising dummy die structures according to an embodiment. Packaged device 100 is one example of an embodiment wherein a dummy die of a packaged device comprises a polymer resin and a filler—e.g., wherein a coefficient of thermal expansion (CTE) of the dummy die is less than that of a mold structure, and wherein a thermal conductivity of the dummy die is greater than that of the mold structure.

As shown in FIG. 1, packaged device 100 comprises one or more integrated circuit (IC) dies—e.g., including the illustrative IC dies 120, 130 shown—and a substrate 110 coupled thereto. For example, substrate 110 is a package substrate or, alternatively, a silicon interposer. Substrate 110 comprises conductive interconnect structures and one or more insulator materials which provide electrical isolation between various ones of said conductive interconnect structures. In various embodiments, interconnect structures of substrate 110 include horizontal layers of patterned conductive traces—e.g., where said layers variously extend along respective x-y planes of the xyz coordinate system shown. Such interconnect structures further include vias which variously extend vertically (e.g., along the z-axis) to couple respective ones of the patterned layers to each other. Said layers and vias—e.g., comprising copper, nickel, gold, silver and/or any of various other conductor materials—facilitate electrical connectivity with one or each of two opposite surfaces 111, 112 of substrate 110. For example, connectivity with substrate 110 (e.g., through substrate 110) is facilitated with conductive contacts which are variously disposed on one or each of opposite surfaces 111, 112.

For example, microbumps 122 electrically couple conductive contacts (e.g., pads) of IC die 120 each to a different respective conductive contact at surface 111—e.g., wherein microbumps 132 electrically couple conductive contacts of IC die 130 to other respective contact at surface 111. The conductive interconnect structures of substrate 110 variously couple IC dies 120, 130 to each other and/or to metallization structures 113 at surface 112 of substrate 110. Such metallization structures 113 (comprising C4 bumps, for example, or solder balls) facilitate coupling of substrate 110 to an organic substrate or, for example, to a printed circuit board.

IC dies 120, 130 can be of a similar type of integrated circuit devices or, alternatively, can be different. For example, in various embodiments, IC dies 120, 130 include any of a variety of one or more application processors, graphics processors, field programmable gate arrays (FPGA), input/output (I/O) controllers, network controllers, or memory devices, and other such devices. Some embodiments are not limited to a particular functionality which is provided with one or the other of IC dies 120, 130. Packaged device 100 includes any of a variety of additional or alternative arrangements of one or more IC dies, in other embodiments.

The example arrangement of IC dies 120, 130 on substrate 110 illustrates a situation which occurs frequently in multi-die package designs, wherein a variety of IC die shapes results in a portion of a substrate surface (the portion referred to herein as a "shelf") being unused for coupling with a die or other component. This unused area poses heat conduction problems where, in some existing devices, a package mold compound is deposited—at significantly varying (z-axis) thicknesses across a surface of the substrate—to form a comparatively thick "mold shelf" over one portion of the substrate. For example, a large mold shelf contributes to yield loss due to warpage, to poor heat transfer during thermal compression bonding of a die stack with an organic package, and/or to decreased reliability lifetime due to higher stresses at a mold-to-silicon interface.

To avoid or otherwise reduce problems posed by such mold shelves, some embodiments provide a structure (referred to herein as a "dummy die") which mitigates thermally induced stresses in a packaged device. In various embodiments, thermal properties of such a dummy die (e.g., including thermal conductivity and thermal expansion), in combination with corresponding thermal properties of an adjoining mold compound, contribute to a packaged device exhibiting more heat tolerant performance characteristics.

In the example embodiment shown, packaged device 100 further comprises a dummy die 140 over a region of surface 111 which is not occupied by any IC die of packaged device 100. Dummy die 140 occupies a volume that, for example, would otherwise be occupied by a package mold of packaged device 100 (e.g., the package mold including the illustrative mold structure 150 shown). Physical properties of dummy die 140, in combination of those of mold structure 150, facilitate improved thermal characteristics of packaged device 100. For example, a CTE of dummy die 140 is less than that of mold structure 150, wherein a thermal conductivity of dummy die 140 is greater than that of mold structure 150. As a result of such a combination of physical properties, dummy die 140 mitigates stresses that would otherwise be contributed to by an extension of mold structure 150 into the volume occupied by dummy die 140.

In various embodiments, dummy die 140 is adhered or otherwise coupled to surface 111 of substrate 110 independent of electrical coupling (if any) with metallization structures of substrate 110. For example, dummy die 140 overlaps and is coupled at a given region of surface 111, wherein any conductive contacts of surface 111 are outside of said region. An absence of conductive contacts in such a region allows more flexibility as to how interconnect structures within substrate 110 are to be routed.

In various embodiments, dummy die 140 is formed, for example, with a pick-and-place process, a cold spray (or other fluid deposition) process, or a lamination process. Use of a low CTE, high thermal conductivity material (e.g., one which omits silicon) for dummy die 140 offers wide flexibility in the material properties to meet any of various warpage resistance requirements.

As used herein, "negative CTE" means a coefficient of thermal expansion less than zero and "positive CTE" means a coefficient of thermal expansion greater than zero. A filler with a negative CTE (NCTE filler) contracts when heated and a filler with a positive CTE expands when heated. An example of a filler with a positive CTE is a currently available filler formed from silica (silica filler). An example of an NCTE filler is a currently available $ZrW_2O_8$.

Examples of NCTE fillers to be used for forming a dummy die structure in various embodiments include (but are not limited to):

a. Zirconium tungstate or $ZrW_2O_8$ (which is a member of the class of compounds having the chemical composition $Zr_xW_yO_z$, where each of x, y, and z is a number of atoms of its respective element).

b. Zirconium Vanadate or $ZrV_2O_7$ (which is a member of the class of compounds having the chemical composition $Zr_xV_yO_z$, where each of x, y, and z is a number of atoms of its respective element).

c. Hafnium tungstate or $HfW_2O_8$ (which is a member of the class of compounds having the chemical composition $Hf_xW_yO_z$, where each of x, y, and z is a number of atoms of its respective element).

d. Hafnium molybdinate or $HfMo_2O_8$ (which is a member of the class of compounds having the chemical composition $Hf_xMo_yO_z$, where each of x, y, and z is a number of atoms of its respective element).
e. Metal cyanide (e.g., Lithium cyanide or LiCN, cyanometalic acids, water-soluble metal cyanide salts, etc.).
f. Members of the $A_2M_3O_{12}$ or $A_2M_4O_{15}$ families, where A is a trivalent cation capable of octahedral coordination (e.g., aluminum (Al), scandium (Sc), yttrium (Y), Lutetium (Lu), Holium (Ho), etc.) and where M is tungsten (W) or molybdenum (Mo).
g. $AOMO_4$, where A is a trivalent cation capable of octahedral coordination (e.g., aluminum (Al), scandium (Sc), yttrium (Y), Lutetium (Lu), Holium (Ho), etc.) and where M is tungsten (W) or molybdenum (Mo).
h. Members of the $AlPO_x$ family, where x is a number of atoms of its respective element.
i. Zeolites.

For example, $ZrW_2O_8$ filler exhibits a negative CTE of approximately 6 ppm/° K to 9 ppm/° K over a temperature range of 0.0° K to 1030° K. That is, a CTE of −6 ppm/° K to −9 ppm/° K over a temperature range of 0.0° K to 1030° K. Thus, and as shown by the example above, the $ZrW_2O_8$ filler and other currently available NCTE fillers may be advantageous over various silica fillers which have a positive CTE, because a lower amount of the NCTE filler (as opposed to a higher amount of silica filler) can be used to modify a polymer or other dummy die material to achieve a given or desired target CTE. Reductions in the amount of a filler used to modify a dummy die material can assist with optimizing at least one of the dummy die material's properties (e.g., viscosity, flow as measured by MFI, moduli, tensile strength, etc.) and reliability (REL) performance of polymer composites and connections within a semiconductor package. REL performance generally considers factors affecting failure rates of polymer composites and connections within a semiconductor package (e.g., toughness, adhesion, long-term stability, etc.).

As used herein, "silica" refers to a chemical compound formed when silicon (S) bonds with oxygen (O). Examples of silica are silicon dioxide ($SiO_2$), flint, opal, etc.

As used herein, "silicate" refers to a compound that is created when silicon (S) and oxygen (O) mix with reactive metals (e.g., Lithium (Li), Aluminum (Al), etc.). Examples of silicates include feldspar, mica, and lithium aluminum silicate. Examples of lithium aluminum silicate are $Li_2OAl_2O_3SiO_2$, which is a member of the class of compounds having the chemical composition $Li_2OAl_2O_3nSiO_2$, where n is a numerical value (e.g., an integer, etc.). Silica is not the same as silicate.

Various embodiments described herein are directed to materials (e.g., polymer composites, etc.) comprising fillers that include lithium aluminum silicate (LAS fillers) for use in semiconductor packaging techniques, or semiconductor packages. In an embodiment, the LAS filler has a chemical formulation of $Li_2OAl_2O_3nSiO_2$, where n is a value (e.g., an integer, etc.). In a specific embodiment, the LAS filler has a chemical composition of $Li_2OAl_2O_3SiO_2$. Embodiments of the LAS fillers described herein provide several advantages over currently available fillers (e.g., currently available silica fillers, currently available NCTE fillers, etc). One specific advantage of the embodiments described herein is that a polymer composite comprising a LAS filler will have a lower amount of filler than a same polymer composite comprising a silica filler. In this way, a lower amount of a LAS filler (as opposed to a relatively higher amount of a silica filler) can be used to modify a polymer composite to achieve a given or desired target CTE of the polymer composite. Also, the CTEs of polymer composites that include a LAS filler can be relatively lower than CTEs of polymer composites that include a currently available silica. This reduction can assist with further optimizing the formulation of polymer composites, which in turn can assist with improving properties of polymer composites (e.g., viscosity, flow as measured by MFI, moduli, tensile strength, etc.) and the REL performance of the polymer composites and connections (e.g., solder joints, etc.) within a semiconductor package (e.g., toughness, adhesion, long-term stability, etc.). Consequently, embodiments of the polymer composites that include LAS fillers, as described herein, provide advantages over polymer composites that include currently available silica fillers. These advantages can assist with reducing manufacturing costs and development times of designing package layouts which include one or more dummy die structures. For example, embodiments of polymer composites that include LAS fillers, as described herein, can assist with low CTE, high thermal conductivity dummy die structures for use in manufacturing novel semiconductor packages that were not previously available.

To achieve low CTE in some embodiments, dummy die 140 is formed by a composite material comprising any of a variety of polymer resins, such as an epoxy resin, and a filler material which exhibits negative CTE (<0 ppm/° C.) characteristics. By way of illustration and not limitation, such a filler material comprises one of zirconium tungstate ($ZrW_2O_8$), hafnium tungstate ($HfW_2O_8$), Zeolite A (also known as Linde Type A, or "LTA"), or lithium aluminasilicate (LAS). In one such embodiment, a volume fraction of the filler in the composite material is at least 70% (e.g., wherein the volume fraction is in a range of between 80% and 90%). In other embodiments, dummy die 140 is a metal which has a CTE less than 12 ppm/° K. Any of various iron-nickel alloys, known as Invar alloys, are an example of a low-CTE metal which form dummy die 140, in various embodiments.

Some embodiments are not limited to the number of separate dummy dies that a packaged device might have, and/or are not limited to a particular shape or aspect ratio of a given one dummy die. For example, in some embodiments, packaged device 100 further comprises one or more other dummy die of the same material, or another material, as dummy die 140. Some or all such dummy die variously span or otherwise extend along the sides of a respective multiple IC dies, in some embodiments.

In some embodiments, formation of dummy die 140 is provided by additive processing wherein a relatively low CTE, high thermal conductivity material is deposited prior to deposition of a mold compound on surface 111, dummy die 140, and the surfaces of IC dies 120, 130. As a result, mold structure 150 is a single body of a contiguous bulk mold compound which (for example) is in contact with surface 111, and the respective top surfaces and sides of dummy die 140 and IC dies 120, 130. In one such embodiment, dummy die 140 is formed on surface 111 prior to a coupling of IC die 120 and/or IC die 130 to surface 111.

In other embodiments, formation of dummy die 140 on surface 111 takes place after at least some mold compound is deposited on surface 111, IC die 120, and/or IC die 130. For example, various embodiments comprise performing an etch, drilling or other subtractive process to create a recess structure in which dummy die 140 is to be formed. In one such embodiment, mold structure 150 comprises two distinct bodies each of a respective contiguous bulk mold compound. For example, a first portion of mold structure 150 forms a recess in which dummy die 140 is disposed—e.g., wherein a second portion of mold structure 150 adjoins dummy die 140, and wherein a material interface is formed where the first portion and the second portion adjoin each other.

Figure 2:
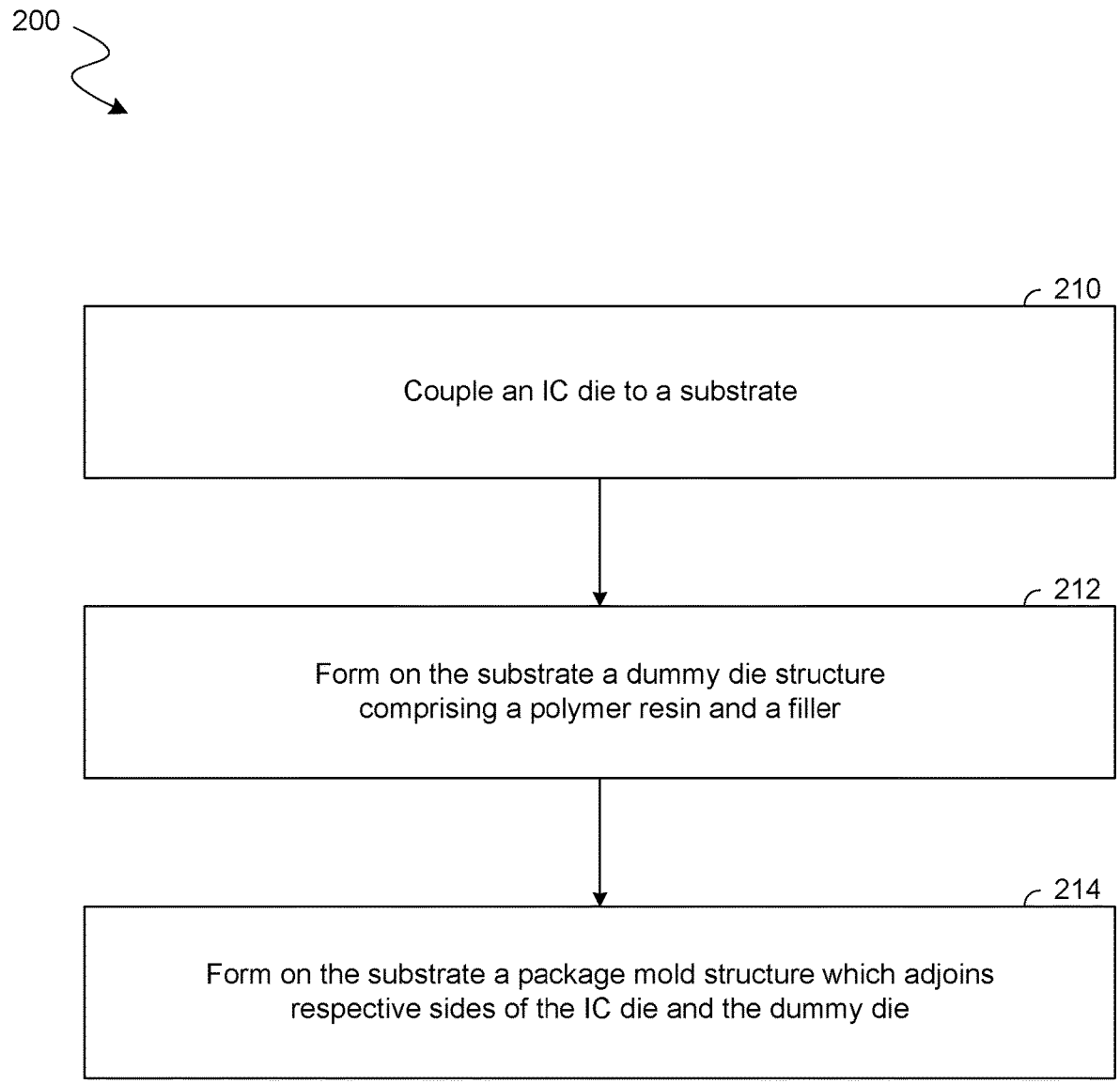
FIG. 2 illustrates a flow diagram showing features of a method to facilitate heat conductivity with a dummy die structure according to an embodiment.

FIG. 2 shows features of a method 200 to provide dummy die structures of a packaged IC device according to an embodiment. Performance of method 200 provides some or all of the functionality of packaged device 100, for example. To illustrate certain features of various embodiments, method 200 is described herein with reference to structures at various states 300-302—shown in FIGS. 3A-3C, respectively—of package processing which are to provide dummy die structures according to an embodiment. However, performance of method 200 provides for any of a variety of additional or alternative structures, in other embodiments.

Figure 3A:
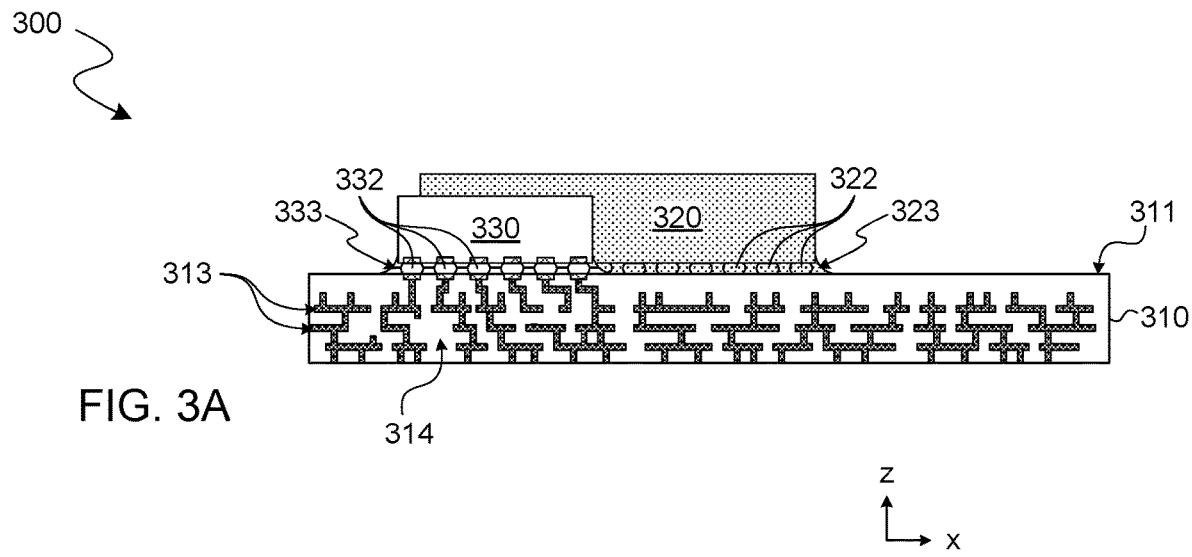
FIGS. 3A-3C illustrate cross-sectional side view diagrams each showing a respective state of processing to package an integrated circuit die with a dummy die according to an embodiment.
Figure 3B:
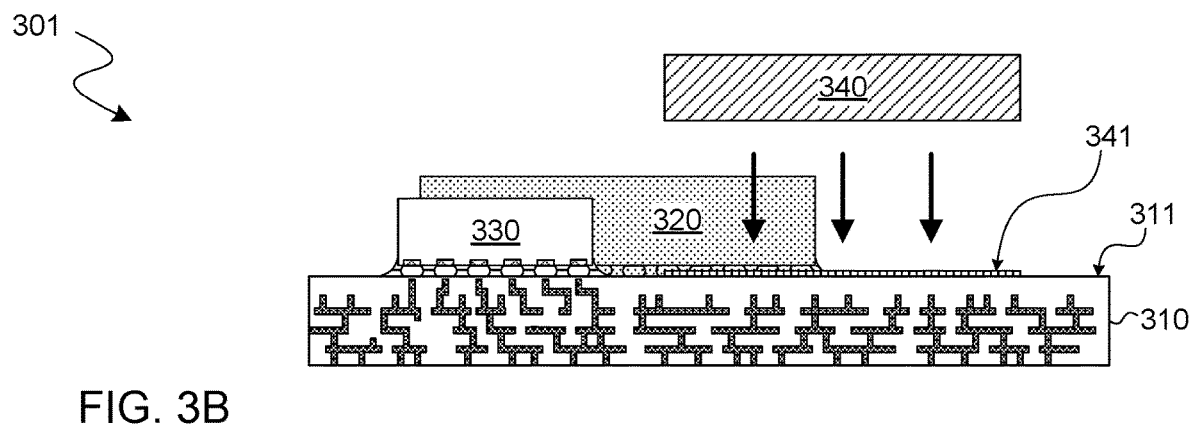
Figure 3C:
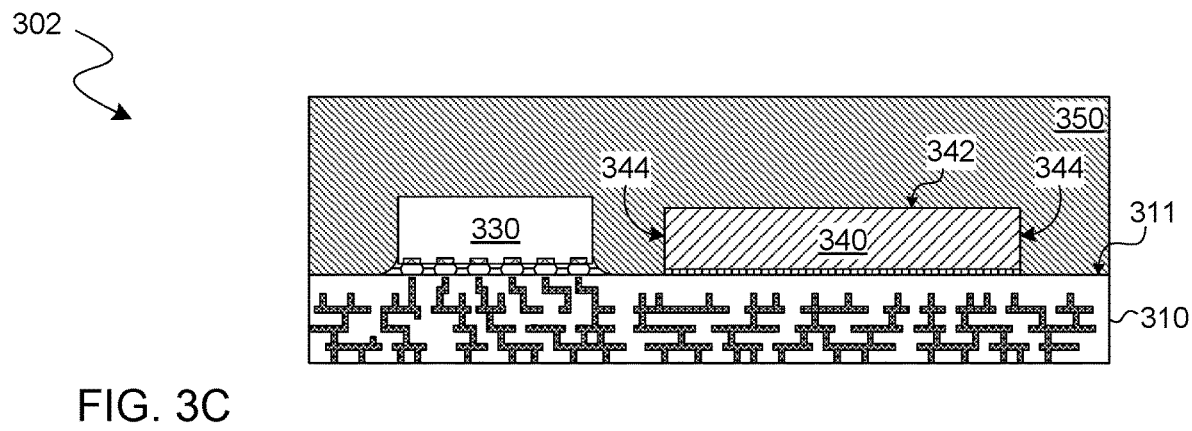

As shown in FIG. 2, method 200 comprises (at 210) coupling an integrated circuit (IC) die to a first region of a substrate. For example, FIG. 3A shows a cross-sectional side view of structures during a state 300 wherein IC dies 320, 330 are variously coupled (e.g., by flip chip connection) to a surface 311 of a substrate 310. By way of illustration and not limitation, IC dies 320, 330 and substrate 310 correspond functionally to IC dies 120, 130 and substrate 110 (respectively). The respective cross-sectional side views of states 300-302 correspond, for example, to a cross-section in the x-z plane which is indicated in FIG. 1 by line 101. It is to be noted that IC die 320 (as indicated by the sharing thereof) is offset from the cross-sectional plane.

At state 300, microbumps 332 variously extend through an underfill 333, between IC die 330 and surface 311, to electrically couple circuitry of IC die 330 to respective ones of interconnect structures 313 which variously extend in a dielectric 314 of substrate 310. Similarly, microbumps 322 extend through another underfill 323 to electrically couple circuitry of IC die 320 to various ones of interconnect structures 313. In other embodiments, an underfill 33 is omitted.

Referring again to FIG. 2, method 200 further comprises (at 212) forming a dummy die structure on a second region of the substrate, the dummy die structure comprising a polymer resin and a filler. In various embodiments, the filler has a negative CTE (NCTE). For example, the filler comprises lithium aluminum silicate having a chemical composition of $Li_2O$—$Al_2O_3$-$nSiO_2$ (where n is a numerical value). Alternatively, the one filler comprises any of various filler materials described herein—e.g., including one of zirconium tungstate, hafnium tungstate, Zeolite A, or lithium aluminum silicate. In one such embodiment, a CTE of the at least on filler is in a range of –6 parts per million per degree Kelvin (ppm/° K) to –9 ppm/° K (for example). In various embodiments, a volume fraction of the filler in the dummy die structure is at least 70% (e.g., wherein the volume fraction is in a range of between 80% and 90%).

For example, as illustrated at state 301, the forming at 212 comprises an adhesive 341 being applied to a region of surface 311 which is to couple to a prefabricated dummy die 340. By way of illustration, adhesive 341 comprises any of various epoxy resins such as, but not limited to, a cycloaliphatic epoxy resin, bisphenol A type epoxy resin, bisphenol-F type epoxy resin, novolac epoxy resin, biphenyl type epoxy resin, naphthalene type epoxy resin, dicyclopentadiene-phenol type epoxy resin, and mixtures thereof. In some embodiments, adhesive 341 further comprises any of a variety of substrate hardeners which (for example) are adapted from conventional techniques for providing an underfill or other material to adhere structures to a substrate.

Subsequently, the prefabricated dummy die 340 is deposited—e.g., with a pick-and-place machine (not shown)—on the adhesive 341, which is then heat cured or otherwise treated to bond dummy die 340 to surface 311. In one such embodiment, dummy die 340 is formed by dicing or other cutting of a wafer, sheet or other structure comprising a relatively low CTE, high thermal conductivity material. In some embodiments, dummy die 340 is a preformed metal structure, wherein a CTE of the metal is less than 12 ppm/° K. Any of various iron-nickel alloys, known as Invar alloys, are an example of a low-CTE metal which form dummy die 340, in various embodiments.

Referring again to FIG. 2, method 200 further comprises, after forming the dummy die structure at 212, forming a package mold structure (at 214) which adjoins respective sides of the IC die and the dummy die. The forming of the package mold structure at 214 comprises depositing a mold material onto respective sides of the IC die and the dummy die, and onto the surface of the substrate. The dummy die structure has a relatively high thermal conductivity, as compared (for example) to a thermal conductivity of the IC die. In an embodiment, a first coefficient of thermal expansion (CTE) of the dummy die structure is less than a second CTE of the package mold structure. Furthermore, a first thermal conductivity of the dummy die structure is greater than a second thermal conductivity of the package mold structure.

For example, as illustrated at state 302, the forming at 214 comprises a mold structure 350 being formed by injection molding other deposition of a mold compound which (for example) is adapted from conventional packaging techniques. By way of illustration and not limitation, mold structure 350 comprise a polymer compound, a poly-resin mold compound, an elastomer mold compound, or any other suitable mold compound material. In the example embodiment shown, mold structure 350 is formed by a single contiguous bulk mold compound which extends over and adjoins some or all of surface 311, a top side 342 of dummy die 340, and some or all sides 344 of IC die 330. Although mold structure 350 is shown as extending over top side 342, in other embodiments, dummy die 340 extends through mold structure 350 to a top surface of the packaged device.

Figure 4A:
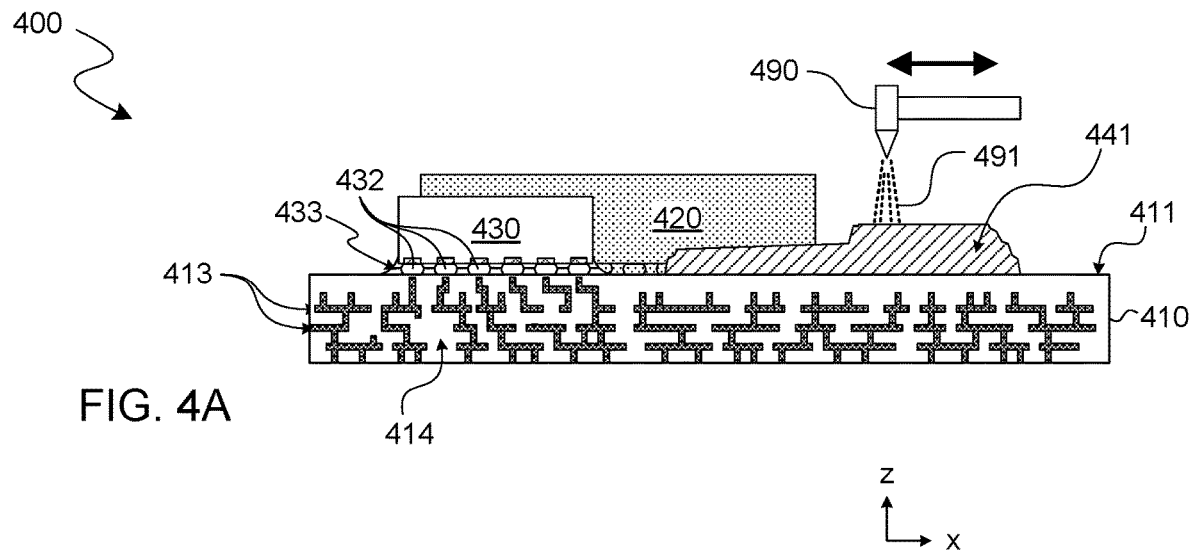
FIGS. 4A-4C illustrate cross-sectional side view diagrams each showing a respective state of processing to package an integrated circuit die with a dummy die according to an embodiment.
Figure 4B:
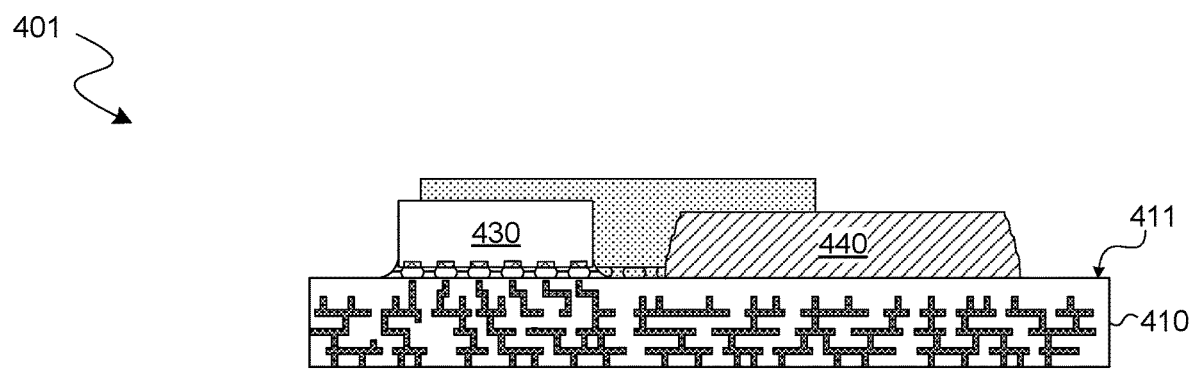
Figure 4C:
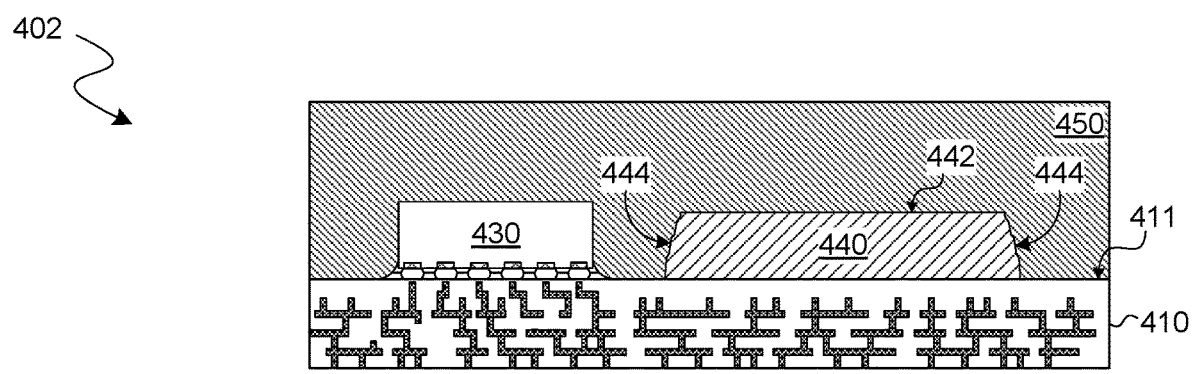

FIGS. 4A-4C show respective states 400-402 of package processing to provide dummy die structures according to another embodiment. States 400-402 is one example of an embodiment wherein a dummy die is fabricated on a surface of a substrate, wherein (as compared to a mold compound which is subsequently deposited onto the surface) the dummy die has a relatively low CTE and a relatively high thermal conductivity. In various embodiments, processing such as that illustrated by states 400-402 is provided according to method 200.

During state 400, IC dies 420, 430 are variously coupled to a surface 411 of a substrate 410—e.g., wherein IC dies 420, 430 and substrate 410 correspond functionally to IC dies 120, 130 and substrate 110 (respectively). For example, microbumps 432 variously extend through an underfill 433 to electrically couple circuitry of IC die 430 to respective ones of interconnect structures 413 which variously extend in a dielectric 414 of substrate 410. IC die 420 is offset from the cross-sectional plane shown for states 400-402 (as indicated by the sharing thereof).

At state 400, a dummy die material is deposited by a high-throughput additive manufacturing (HTAM) process such as a cold spray deposition. HTAM enables an efficient formation of a material, the physical properties of which (in combination with physical properties of a mold compound) are to mitigate heat-induced stresses of a packaged device.

For example, the cross-sectional view of stage 400 in FIG. 4A illustrates a HTAM process wherein a dispenser 490 moves, relative to surface 411, while a spray 491 of particles is emitted from a nozzle of dispenser 490 and onto surface 411. Such spraying variously deposits a material 441 of a dummy die structure. The HTAM process at stage 400 comprises, for example, a cold spray deposition of one or more solid powders, each of a suitable material (or material mixture). Cold spray deposition of material 441 protects other structures in or on substrate 410 from being exposed to higher temperatures, and (for example) avoids the need for some other patterned deposition processes that might otherwise be performed.

In one such embodiment, spray 491 comprise a particles of a polymer, a poly-resin, an elastomer or other suitable material, as well as particles of a filler material which exhibits low CTE (or negative CTE) properties. In various embodiments, the filler material comprises zirconium tungstate, hafnium tungstate, Zeolite A, or lithium aluminasilicate—e.g., wherein a volume fraction of the filler material 441 is at least 70% (and, in some embodiments, in a range of between 80% and 90%). In one such embodiment, spray 491 is accelerated in a jet of a compressed carrier gas, such as air or nitrogen ($N_2$)—e.g., where the nozzle is a converging diverging nozzle. The impact of spray 491 on side surface 411 causes jet particles to plastically deform and bond to surface 411 and/or to previously deposited portions of material 441. In other embodiments, any of a variety of conventional underfill dispense or auger dispense mechanisms and techniques (for example) are adapted to could also be used to deposit material 441.

As shown at state 401, application of spray 491 to deposit material 441 results in the formation of a dummy die 440 which (for example) has some or all features of dummy die 140. Subsequently, at state 402, a mold structure 450 is formed by injection molding other deposition of a mold compound—e.g., where such deposition is adapted from conventional packaging techniques. By way of illustration and not limitation, mold structure 450 comprise a polymer, a poly-resin, an elastomer, or other suitable mold compound material which (as compared to the material of dummy die 440) exhibits a relatively high CTE, and a relatively low thermal conductivity. In the example embodiment shown, mold structure 450 is formed by a single contiguous bulk mold compound which extends over and adjoins some or all of surface 411, a top side 442 of dummy die 440, and some or all sides 444 of IC die 440.

Figure 5A:
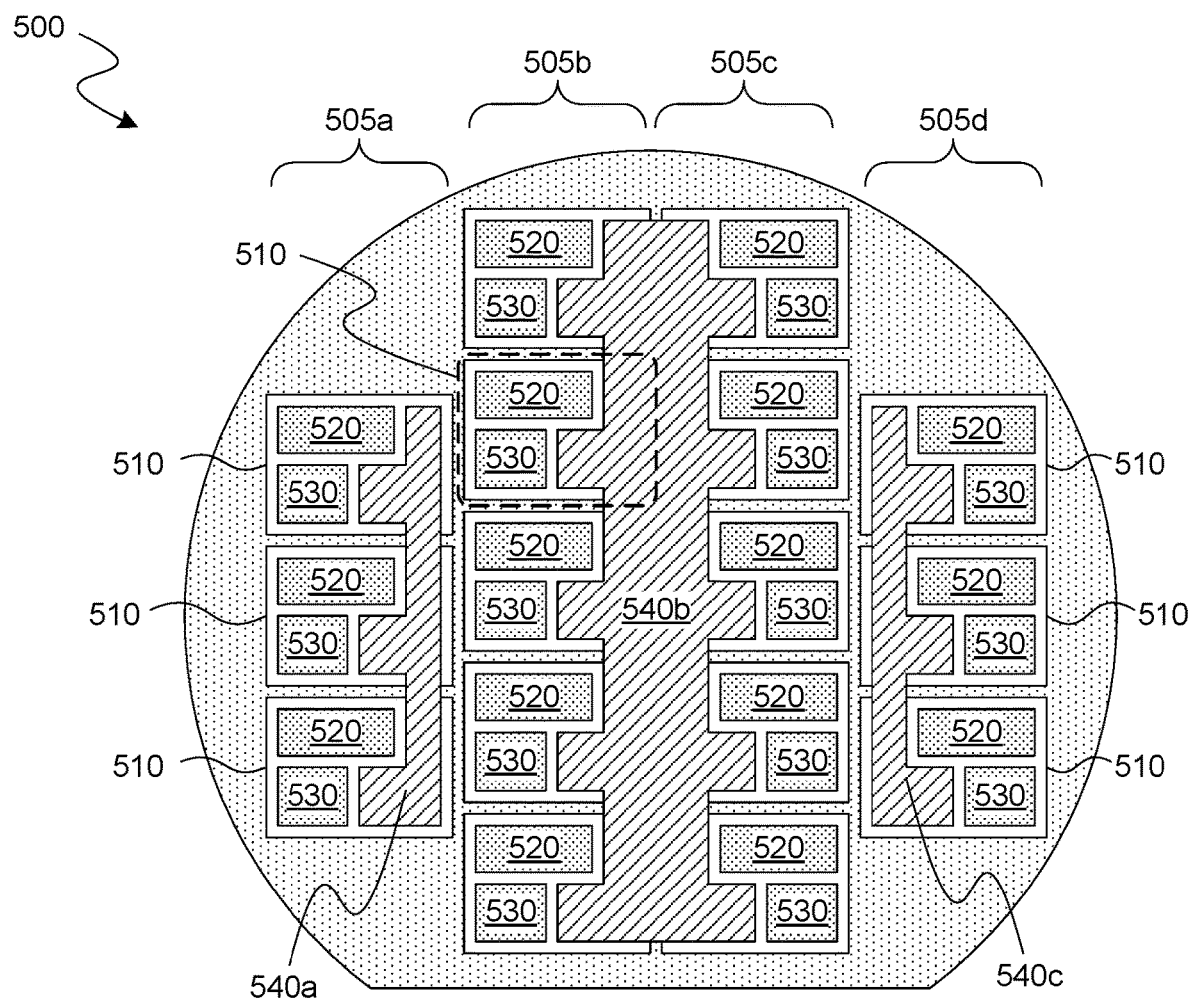
FIGS. 5A, 5B illustrate top side plan view diagrams each showing respective features of a wafer to facilitate a manufacture of heat conductor structures according to a corresponding embodiment.
Figure 5B:
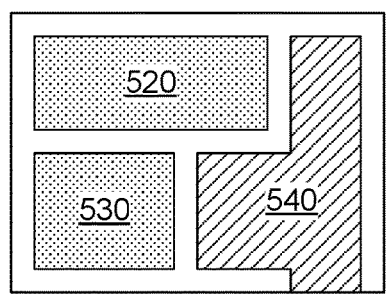

FIG. 5A, 5B shows features of a wafer 500 to facilitate manufacture of a dummy die according to an embodiment. Wafer 500 is one example of an embodiment wherein a lamination process forms dummy die structures, at least in part, prior to the coupling of some or all IC dies on a substrate.

As shown in FIG. 5A, silicon wafer 500 comprises portions 510 which are each to be subsequently diced or otherwise singulated from each other to form respective silicon interposers. For example, portions 510 are variously arranged into columns 505a-505d which facilitate such singulation.

In one such embodiment, portions 510 are each to form a respective substrate that (for example) has some or all features of substrate 110. For example, portions 510 each include respective regions 520, 530 onto which different respective IC dies are to be coupled. By way of illustration and not limitation, the region 520 of a given one of portions 510 is to receive IC die 120—e.g., wherein the region 530 of that same portion 510 is to receive IC die 130.

To mitigate the risk of device degradation due to heat-related stresses, some embodiments provide dummy die structures which are formed, at least in part, on some or all of portions 510 prior to the coupling of any IC dies thereon, and (in some embodiments) prior to singulation of portions 510 from each other. For example, a laminate film of a dummy die material is pre-cut and applied to wafer 500 to form laminate structures 540a, 540b, 540c which each extend on various regions of respective ones of portions 510. The dummy die material of laminate structures 540a, 540b, 540c is, for example, that of dummy die 140, dummy die 340, or dummy die 440.

After application of laminate structures 540a, 540b, 540c thereon, wafer 500 is diced to singulate portions 510 from each other. In one such embodiment, some or all of laminate structures 540a, 540b, 540c variously span regions between respective ones of portions 510. For example, laminate structure 540b spans a lane between columns 505b, 505c, and laminate structure 540a, 540c variously span the respective columns 505a, 505c. As a result, an interposer formed by dicing of wafer 500 comprises a dummy die which extends to an edge of that interposer. For example, FIG. 5B shows an interposer 590 which is formed by the singulation of that one of portions 510 which is at a top of column 505a. Due to the shape of laminate structure 540a, a dummy die 540—formed therefrom—is disposed on, and extends to an edge of, interposer 590.

Figure 6A:
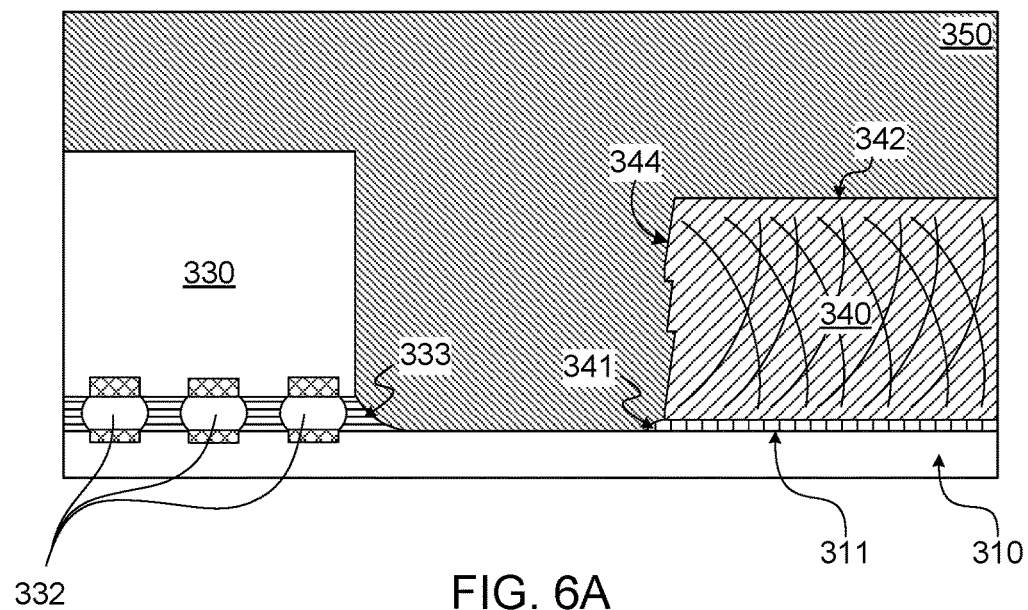
FIGS. 6A-6C illustrate cross-sectional side view diagrams each showing respective features of a packaged device according to a corresponding embodiment.

FIG. 6A shows a cross-sectional view of a packaged device 600 which, according to one example embodiment, is formed by the processing illustrated by states 300-302. Packaged device 600 illustrates structures which, in one embodiment, result from a package mold being formed only after a prefabricated dummy die is adhered to a surface of an interposer.

Due at least in part to such processing, mold structure 350 is a contiguous body of a bulk mold compound which extends over IC die 330, and dummy die 340. For example, in various embodiments, mold structure 350 adjoins and extends along a side surface 344 of dummy die 340 (e.g., from top surface 342 of IC die 330 to adhesive 341 and/or surface 311). Alternatively or in addition, mold structure 350 adjoins and extends along a side of IC die 330 (e.g., from a top surface of IC die 330 to underfill 333). Alternatively or in addition, mold structure 350 adjoins an extends along an entirety of a region of surface 311 from adhesive 341 (and/or from dummy die 340) to underfill 333.

Although some embodiments are not limited in this regard, side surfaces 344 of dummy die 340 comprises an artifact of cutting, grinding, polishing, etching, and/or other processing which singulates (or otherwise determines a shape of) dummy die 340. In one such embodiment, top surface 342 of dummy die 340 additionally or alternatively comprises an artifact of cutting, grinding, polishing and/or other processing to thin or otherwise remove dummy die material.

Figure 6B:
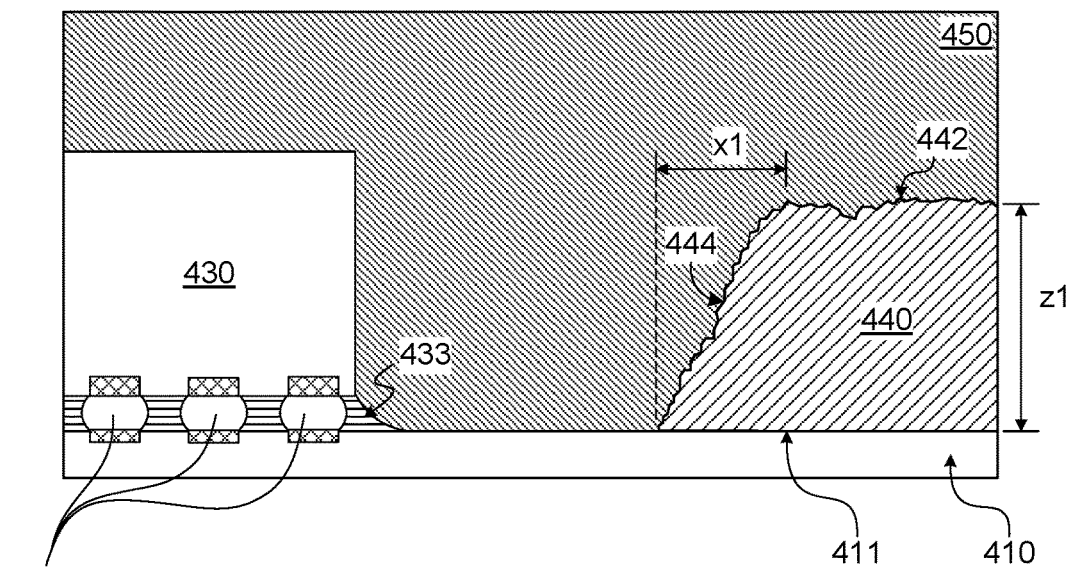

FIG. 6B shows a cross-sectional view of a packaged device 650 which, according to one example embodiment, is formed by the processing illustrated by states 400-402. Packaged device 650 illustrates structures which, in one embodiment, result from a package mold being formed only after a dummy die material is sprayed on a surface of an interposer.

Due at least in part to such processing, mold structure 450 is a contiguous body of a bulk mold compound which extends over IC die 430, and dummy die 440. For example, in various embodiments, mold structure 450 adjoins and extends along a side surface 444 of dummy die 440 (e.g., from top surface 442 of IC die 430 to surface 411). Alternatively or in addition, mold structure 450 adjoins and extends along a side of IC die 430 (e.g., from a top surface of IC die 430 to underfill 433). Alternatively or in addition, mold structure 450 adjoins an extends along an entirety of a region of surface 411 from dummy die 440 to underfill 433.

Although some embodiments are not limited in this regard, dummy die 440 comprises one or more artifacts of a cold spray (or other fluid deposition) process. In one such embodiment, a side surface 444 slopes by a horizontal distance xl over the vertical distance z1 which is spanned by dummy die 440. In one such embodiment, distance z1 is at least 1 millimeter (mm), and the distance xl is at least 3% of distance z1 (e.g., wherein distance xl is at least 5%—and, in some embodiments, at least 10%—of distance z1).

Figure 6C:
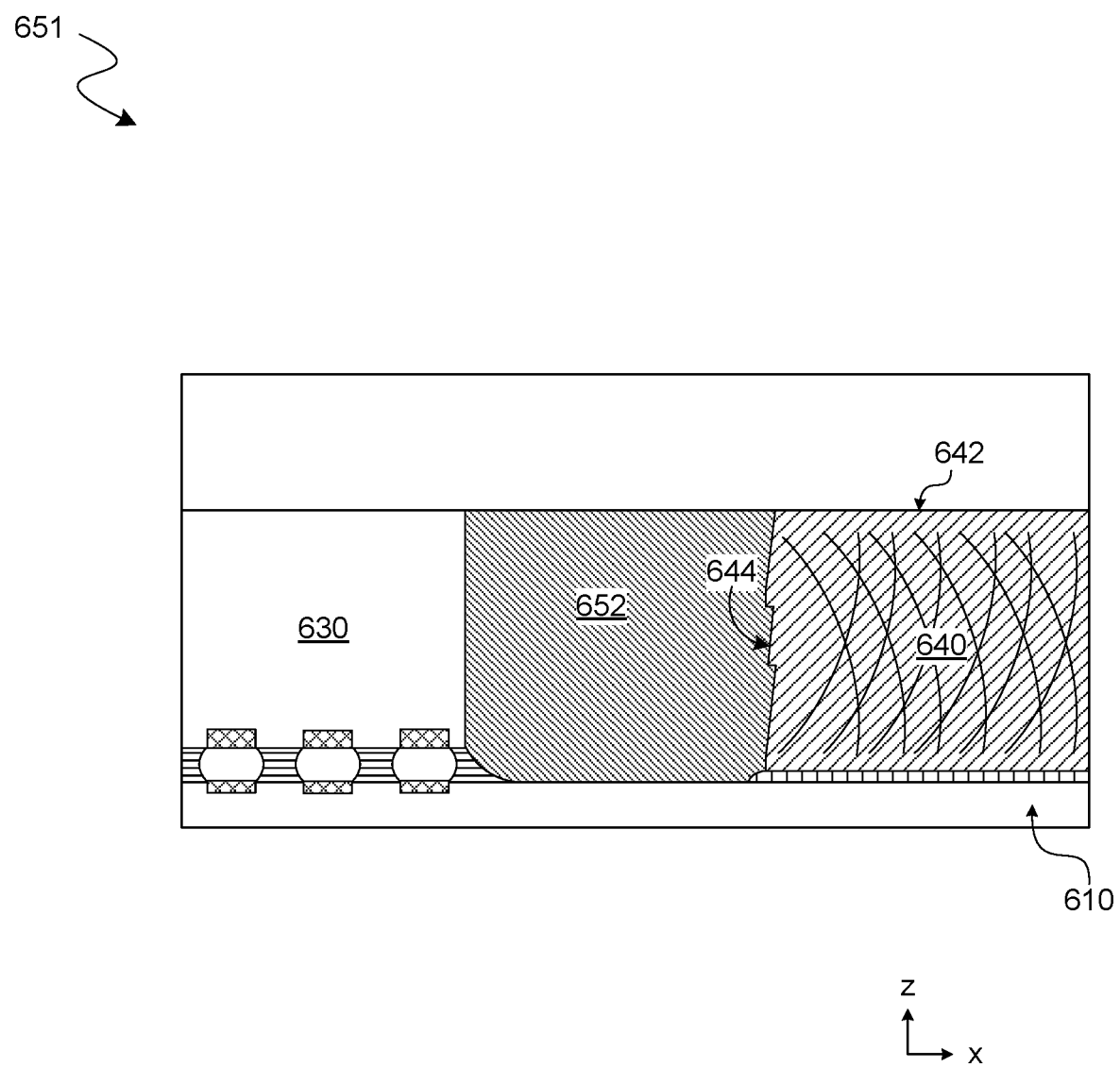

FIG. 6C illustrates a packaged device 651 which includes dummy die structures according to another embodiment. In the example embodiment shown, packaged device 651 includes one or more features of packaged device 600—e.g., wherein a substrate 610, an IC die 630, a dummy die 640, and a mold structure 652 of packaged device 651 correspond functionally to substrate 310, IC die 330, dummy die 340, and mold structure 350 (respectively).

Packaged device 651 illustrates an embodiment wherein, at some point, a deposited dummy die material—e.g., that of a pre-formed dummy die structure—extends to or above a vertical (z-axis) height of IC die 630. A package mold material is subsequently deposited on substrate 610 (e.g., in a region between IC die 630 and the dummy die material). Afterward, a grinding, polishing and/or other subtractive process is performed to remove some of the package mold material (and, for example, some of the dummy die material). In various embodiments, such processing results in dummy die 640 extending past (e.g., through) mold structure 652, wherein a top surface 642 of dummy die 640 forms a top side of packaged device 651 at least in part. In one such embodiment, mold structure 652 leaves a top side of IC die 630 exposed (although some embodiments are not limited in this regard). Mold structure 652 adjoins a side surface 644 of dummy die 640, in some embodiments.

Figure 7:
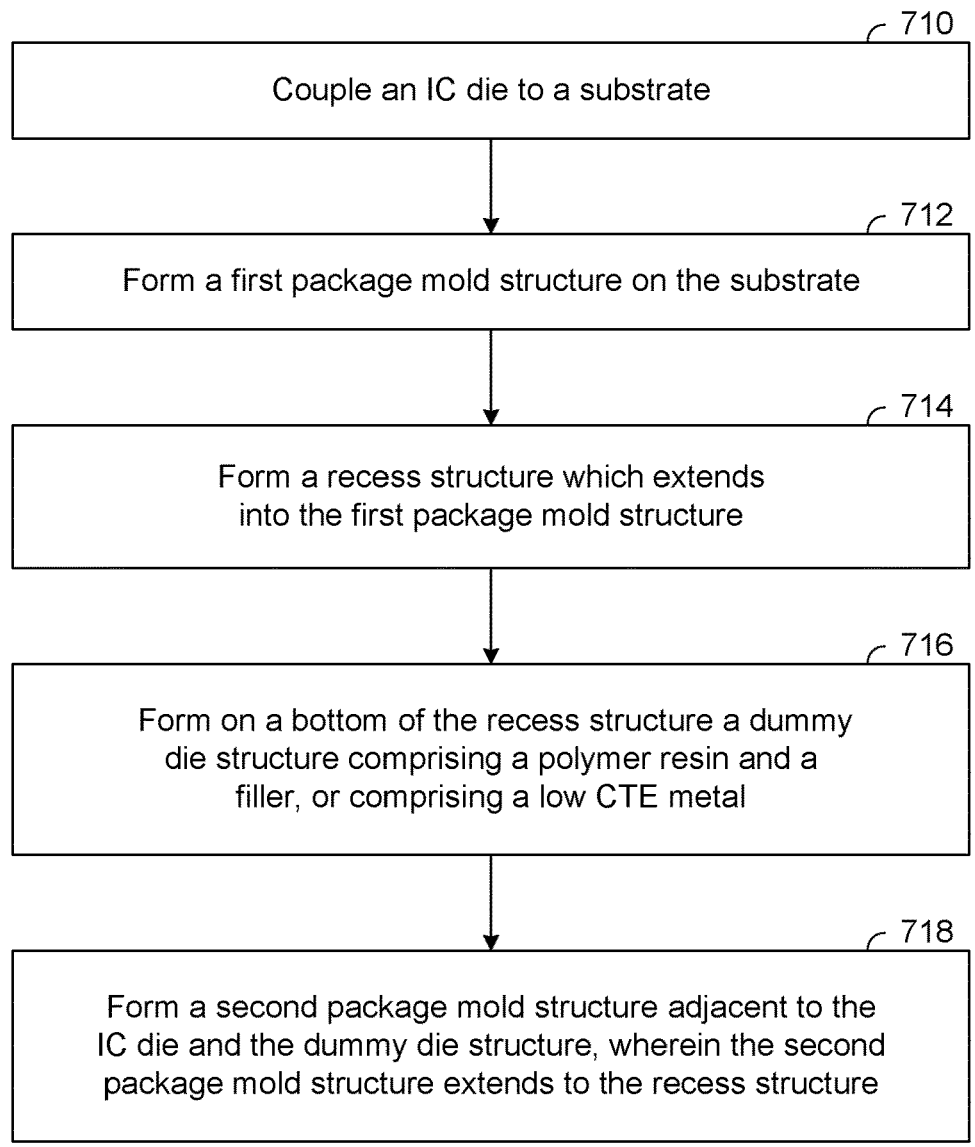
FIG. 7 illustrates a flow diagram showing features of a method to facilitate heat conductivity with a dummy die structure according to an embodiment.

FIG. 7 shows features of a method 700 to provide dummy die structures of a packaged IC device according to another embodiment. Performance of method 700 provides some or all of the functionality of packaged device 100, for example. To illustrate certain features of various embodiments, method 700 is described herein with reference to structures at various states 800-803—shown in FIGS. 8A-8D, respectively—of package processing which are to provide dummy die structures according to an embodiment. However, performance of method 700 provides for any of a variety of additional or alternative structures, in other embodiments.

Figure 8A:
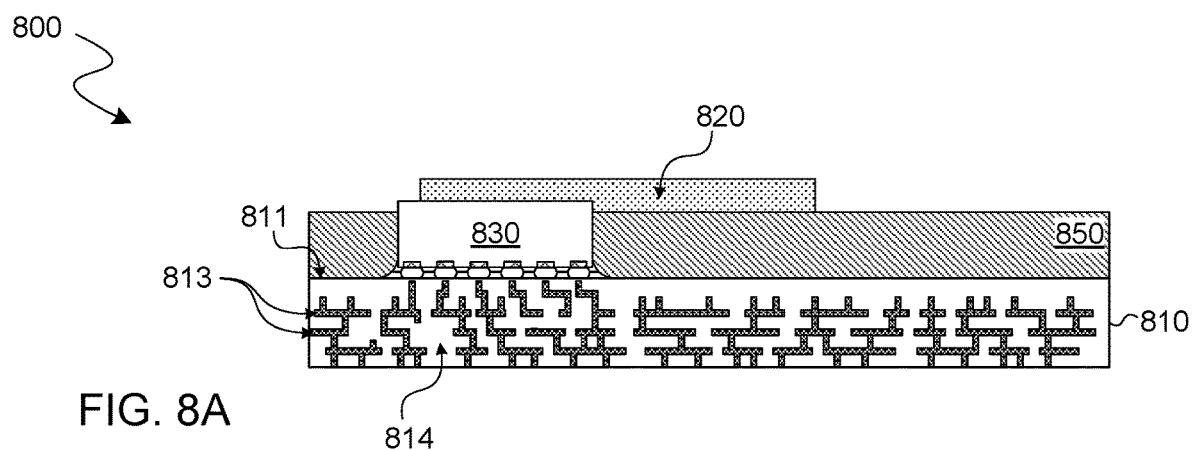
FIGS. 8A-8D illustrate cross-sectional side view diagrams each showing a respective state of processing to package an integrated circuit die with a dummy die according to an embodiment.
Figure 8B:
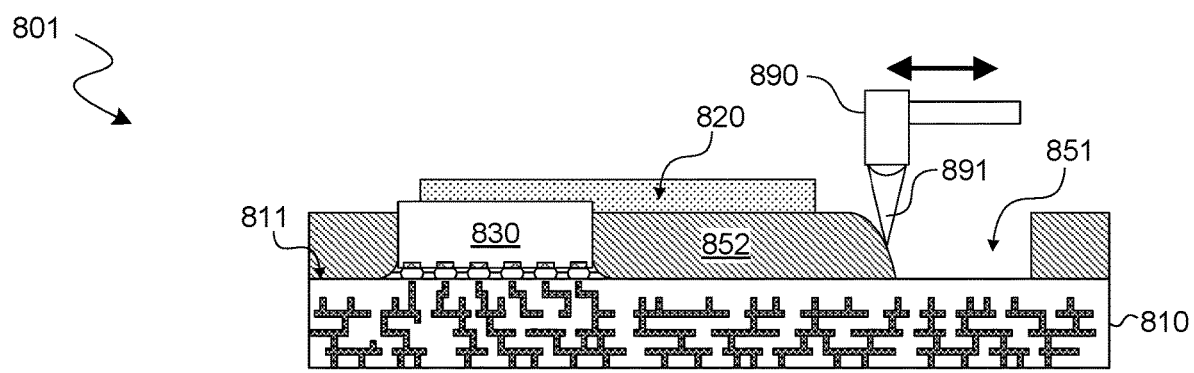
Figure 8C:
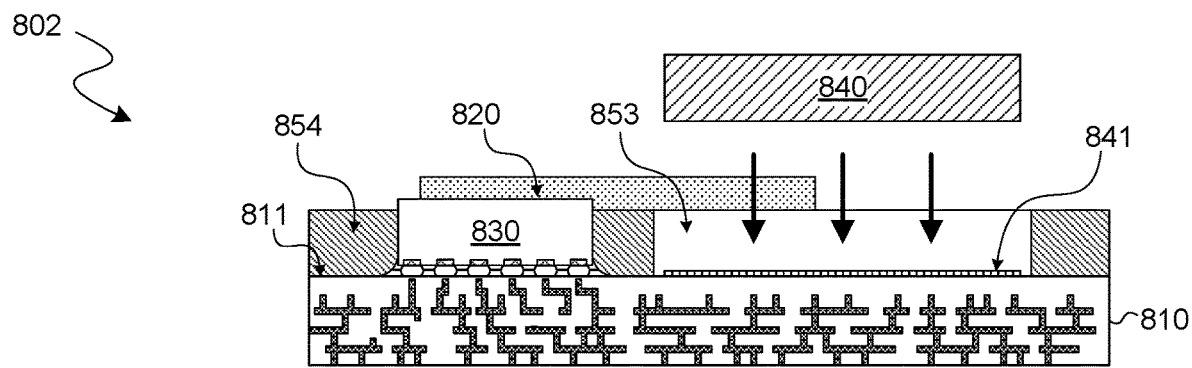
Figure 8D:
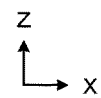
Figure 8D:
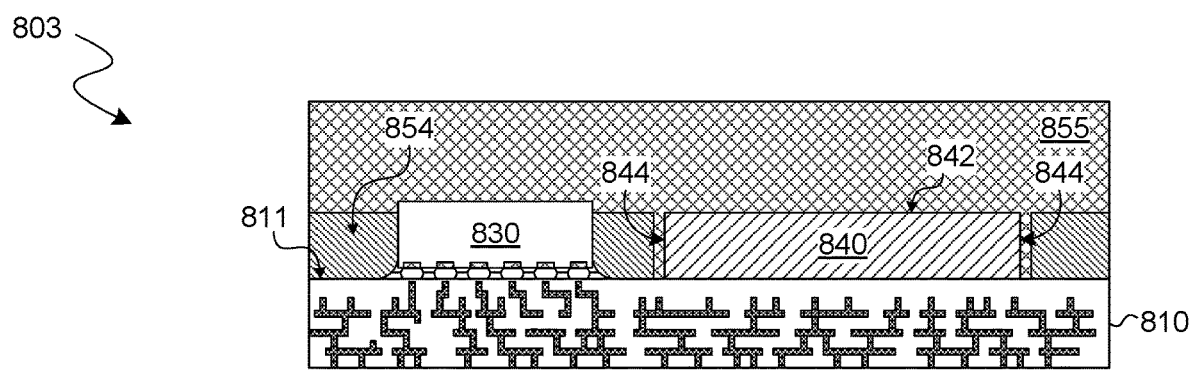

As shown in FIG. 7, method 700 comprises (at 710) coupling an IC die to a first region of a substrate—including, for example, some or all features of the coupling at 210—and (at 712) forming a first package mold structure on a second region of the substrate. After the coupling at 710 and the forming at 712, the first package mold structure is adjacent to the IC die. For example, FIG. 8A shows a cross-sectional side view of structures during a state 800 wherein IC dies 820, 830 are variously coupled to a surface 811 of a substrate 810. By way of illustration and not limitation, IC dies 820, 830 and substrate 810 correspond functionally to IC dies 120, 130 and substrate 110 (respectively). Interconnect structures 813 variously extend in a dielectric 814 of substrate 810 to facilitate electrical coupling of respective circuits of IC dies 820, 830 with each other and/or with other circuit resources In the example of state 800, the forming at 712 comprises a mold structure 850 being formed by injection molding other deposition of a mold compound which (for example) is adapted from conventional packaging techniques. By way of illustration and not limitation, mold structure 850 comprise a polymer compound, a poly-resin mold compound, an elastomer mold compound, or any other suitable mold compound material. In the example embodiment shown, mold structure 850 extends only partially over one or more structures—e.g., wherein one or both of IC dies 820, 830 remain exposed in part.

Referring again to FIG. 7, method 700 further comprises (at 714) forming a recess structure which extends into the first package mold structure—e.g., using any of various subtractive processes such as laser drilling (or, for example, a mechanical drilling). In the example of state 801, the forming at 714 comprises a laser drilling process wherein a laser 890 moves, relative to surface 811, while a beam 890 of laser light is emitted from a lens of laser 890 and onto portions of mold structure 850. Exposure to beam 890 variously removes portions of mold structure 850—e.g., wherein, during such exposure, an intermediary mold structure 852 forms a partial recess structure 851.

Referring again to FIG. 7, method 700 further comprises (at 716) forming a dummy die structure on a bottom of the recess structure, the dummy die structure comprising a polymer resin and a filler, or—alternatively—comprising a low CTE (e.g., less than 12 ppm/° K) metal. In various embodiments, the dummy die structure comprises the polymer resin and the filler, wherein the filler has a negative CTE (NCTE). For example, the filler comprises lithium aluminum silicate having a chemical composition of $Li_2O$—$Al_2O_3$-$nSiO_2$ (where n is a numerical value). Alternatively, the filler comprises any of various filler materials described herein—e.g., including one of zirconium tungstate, hafnium tungstate, Zeolite A, or lithium aluminum silicate. In one such embodiment, a CTE of the at least on filler is in a range of −6 parts per million per degree Kelvin (ppm/° K) to −9 ppm/° K (for example). In various embodiments, a volume fraction of the filler in the dummy die structure is at least 70% (e.g., wherein the volume fraction is in a range of between 80% and 90%). In other embodiments, the dummy die structure comprises the metal, such as any of various Invar alloys of iron and nickel.

For example, as illustrated at state 802, the forming at 712 comprises an adhesive 841 (e.g., having features of adhesive 341) being applied to a bottom of a final recess structure 853 which is formed by a resulting mold structure 854 at 714. Subsequently, the prefabricated dummy die 840 is deposited on adhesive 841, which is then cured or otherwise treated to bond dummy die 840 to the bottom of recess structure 853. In various embodiments, dummy die 840 has features of one of dummy dies 140, 340—e.g., wherein dummy die 840 comprises a polymer resin and a filler, or alternatively, comprises a metal (such as any of various Invar alloys) which have a CTE less than 12 ppm/° K.

Referring again to FIG. 7, method 700 further comprises, after forming the dummy die structure at 716, forming on the first package mold structure a second package mold structure (at 718) adjacent to the IC die and the dummy die structure. The second package mold structure extends to the recess structure—e.g., wherein the second package mold structure comes to an edge of (and, in some embodiments, extends into) the recess structure. In an embodiment, a first CTE of the dummy die structure is less than a second CTE of one of the first package mold structure or the second package mold structure, and wherein a first thermal conductivity of the dummy die structure is greater than a second thermal conductivity of the one of the first package mold structure or the second package mold structure.

For example, as illustrated at state 803, the forming at 718 comprises another mold structure 855 being formed on respective surfaces of mold structure 854 and dummy die 840 (and, in some embodiments, also on respective surfaces of substrate 810 and/or IC dies 820, 830). The subsequent formation of mold structure 855 results in a material interface between the respective compounds of mold structure 854 and mold structure 855. In one such embodiment, the same compound is on either side of said material interface—e.g., wherein the material interface is formed by a line (and, for example, a plane) of structural discontinuity between mold structures 854, 855. In another embodiment, mold structures 854, 855 comprise different respective mold compounds which each extend to form said material interface.

In some embodiments, mold structure 855 adjoins and extends along a top surface 842 of dummy die 840 and, in some embodiments, along one or more side surfaces 844 of dummy die 840. In one such embodiment, a portion of mold structure 855 extends between (and, for example, adjoins) a side surface 844 and another portion of mold structure 854. Although mold structure 855 is shown as extending over top side 842, in other embodiments, dummy die 840 extends through mold structure 850 to a top surface of the packaged device.

FIGS. 9A-9D show respective states 900-903 of package processing to provide dummy die structures according to another embodiment. States 900-903 is one example of an embodiment wherein a dummy die is fabricated on a bottom of a recess structure which extends into a first mold compound structure, wherein a second mold compound structure extends over the first mold compound structure and the dummy die. As compared to one or both of the first and second mold compound structures, the dummy die has a relatively low CTE, and a relatively high thermal conductivity. In various embodiments, processing such as that illustrated by states 900-903 is provided according to method 700.

Structures at state 900 are similar, for example, to those at 802—e.g., wherein IC dies 920, 930 are variously coupled to a surface 911 of a substrate 910. Laser drilling and/or other subtractive processing forms a recess structure 953 which extends into a mold structure 954 that is deposited on regions of surface 911 (and, in some embodiments, at least partially along respective sides of one or more of IC dies 920, 930). Interconnect structures 913 and a dielectric 914 of substrate 910 correspond functionally to interconnect structures 313 and dielectric 314 (respectively), for example.

Figure 9A:
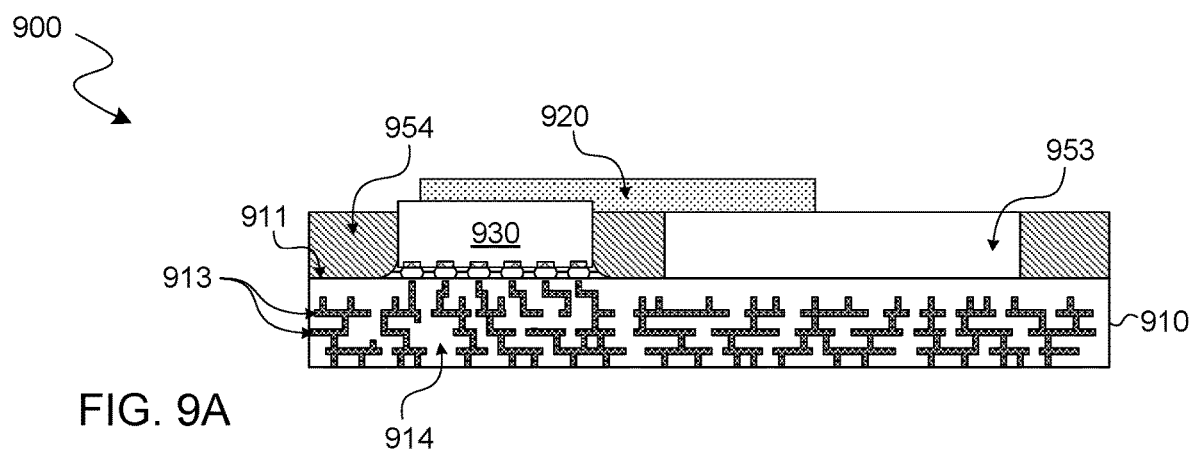
FIGS. 9A-9D illustrate cross-sectional side view diagrams each showing a respective state of processing to package an integrated circuit die with a dummy die according to an embodiment.
Figure 9B:
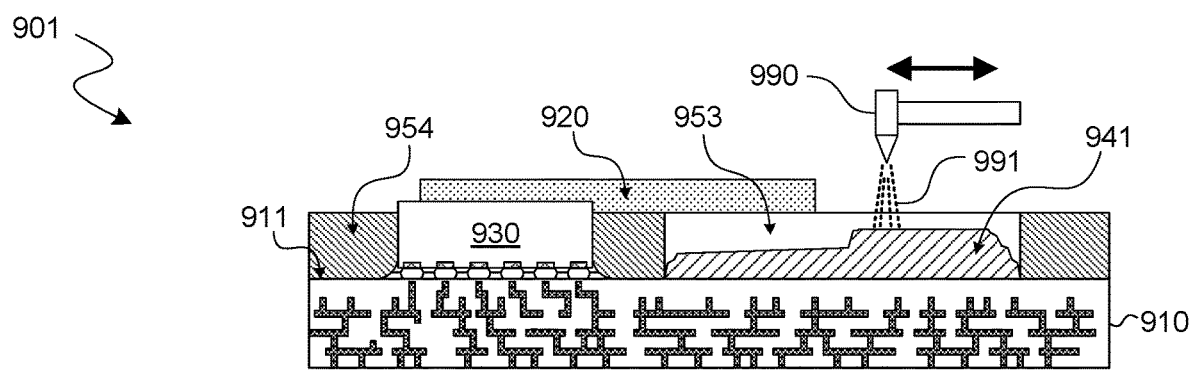
Figure 9C:
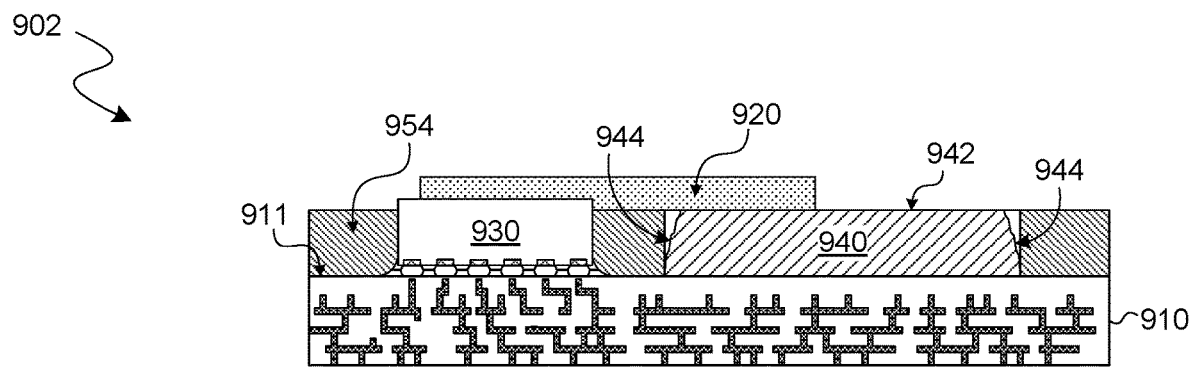
Figure 9D:
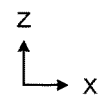
Figure 9D:
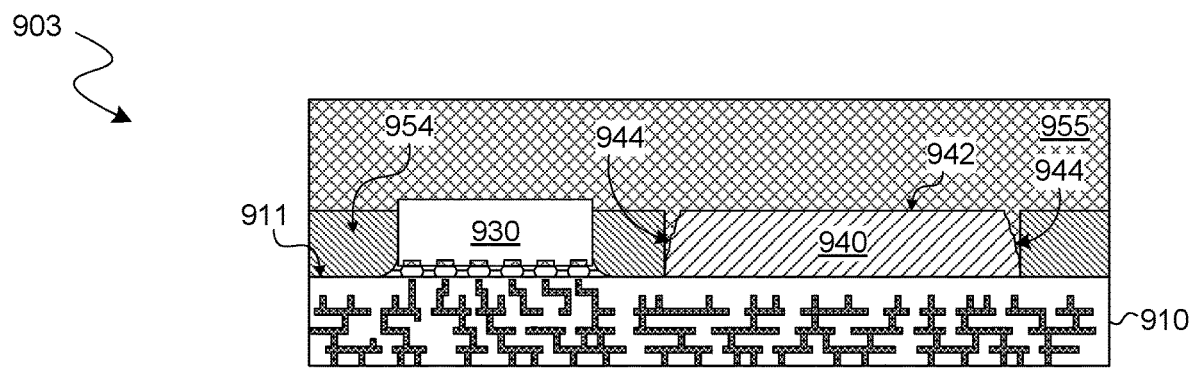

At state 901, a dummy die material is deposited by a high-throughput additive manufacturing (HTAM) process such as a cold spray deposition. For example, the cross-sectional view of stage 901 in FIG. 9B illustrates a HTAM process a spray 991 of particles is emitted from a nozzle while a dispenser 990 is moved along surface 911. In various embodiments, the HTAM process at stage 901 comprises features such as those of the HTAM process at state 400—e.g., wherein spray 991 deposits a low CTE, high thermal conductivity material 941. In one such embodiment, material 941 comprise a particles of a polymer, poly-resin, elastomer or other suitable material, and particles of a low CTE (or negative CTE) filler.

As shown at state 902, application of spray 991 to deposit material 941 results in the formation of a dummy die 940 which (for example) has some or all features of dummy die 140. Subsequently, at state 903, another mold structure 955 is formed on respective surfaces of mold structure 954 and dummy die 940 (and, in some embodiments, also on respective surfaces IC dies 920, 930 and/or other structures of substrate 910). The subsequent formation of mold structure 955 results in a material interface between the respective compounds of mold structure 954 and mold structure 955.

In some embodiments, mold structure 955 adjoins and extends along a top surface 942 of dummy die 940 and, in some embodiments, along one or more side surfaces 944 of dummy die 940. In one such embodiment, a portion of mold structure 955 extends between (and, for example, adjoins) a side surface 944 and another portion of mold structure 954.

Figure 10A:
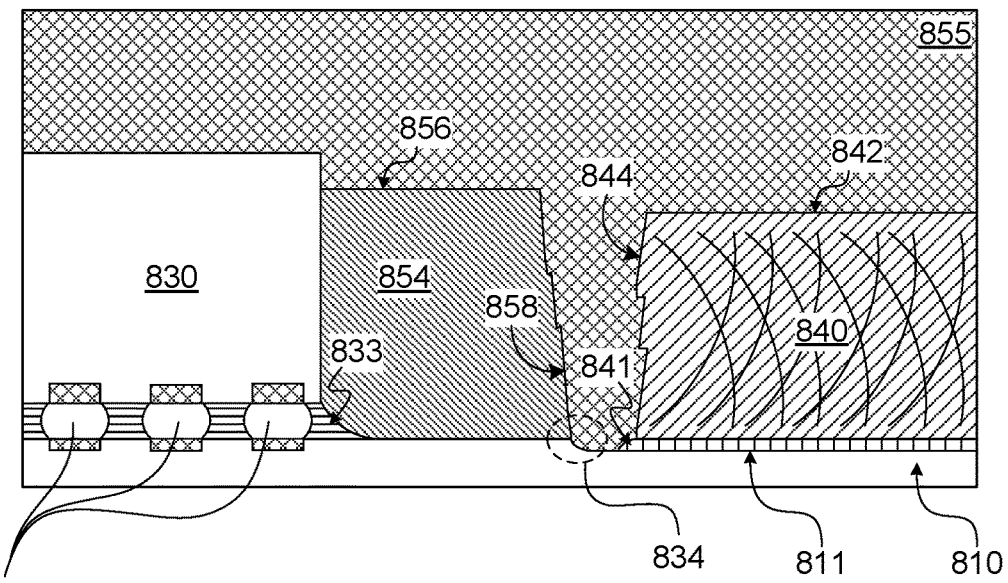
FIGS. 10A-10C illustrate cross-sectional side view diagrams each showing respective features of a packaged device according to a corresponding embodiment.

FIG. 10A shows a cross-sectional view of a packaged device 1000 which, according to one example embodiment, is formed by the processing illustrated by states 800-803. Packaged device 1000 illustrates structures which, in one embodiment, result from one package mold structure being formed after a prefabricated dummy die is adhered to a bottom of a recess structure which extends into a previously-formed package mold structure.

Due at least in part to such processing, mold structure 854 adjoins and extends along a side of IC die 830 (e.g., from an underfill 833 and at least partially toward a top of IC die 830). Microbumps 832 variously extend through underfill 833, between IC die 830 and surface 811—e.g., to electrically couple circuitry of IC die 830 to respective ones of interconnect structures 813 which variously extend in dielectric 814.

By contrast, mold structure 855 extends over IC die 810, mold structure 854, and dummy die 840—e.g., wherein mold structure 855 adjoins a top surface 842 of dummy die 840. A material interface region 856 is formed where, for example, mold structure 855 adjoins a top surface of mold structure 854. The material interface extends to include a region 858 where mold structure 855 adjoins a side surface of mold structure 854.

Although some embodiments are not limited in this regard, side surfaces 844 and/or top surface 842 of dummy die 840 comprise an artifact of cutting, and/or other subtractive processing which determines a shape of dummy die 840. Alternatively or in addition, packaged device 1000 comprises one or more artifacts of a substractive process to form recess structure 853. By way of illustration and not limitation, region 834 includes an undercut structure where surface 811 recesses slightly due to laser drilling which extended to remove portions of dielectric 814.

Figure 10B:
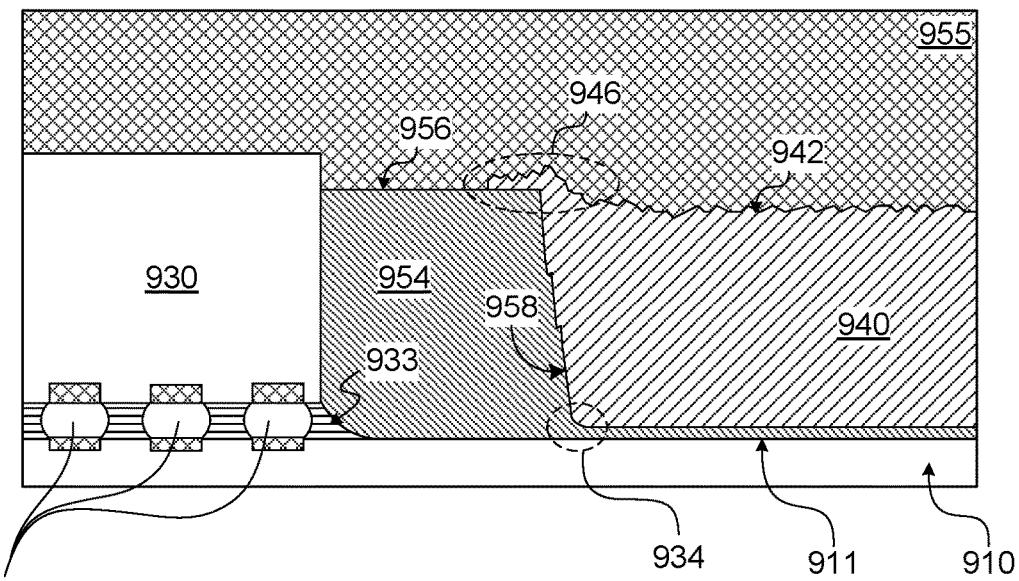

FIG. 10B shows a cross-sectional view of a packaged device 1050 which, according to another example embodiment, is formed by the processing illustrated by states 900-903. Packaged device 1050 illustrates structures which, in one embodiment, result from one package mold structure being formed after a dummy die is fabricated on a bottom of a recess structure which extends into a previously-formed package mold structure.

Due at least in part to such processing, mold structure 954 adjoins and extends along at least a portion of a side of IC die 930 from an underfill 933. Microbumps 932 variously extend through underfill 933 to electrically couple circuitry of IC die 930 to respective ones of interconnect structures 913 which variously extend in dielectric 914. Furthermore, dummy die 940 extends to adjoin a side 958 of mold structure 954. In one such embodiment, mold structure 955 extends over IC die 910, mold structure 954, and dummy die 940—e.g., wherein mold structure 955 adjoins a top surface 942 of dummy die 940. A material interface region 956 is formed where, for example, mold structure 955 adjoins a top surface of mold structure 954.

Although some embodiments are not limited in this regard, packaged device 1050 comprises one or more artifacts of a spray deposition processing which formed dummy die 940. For example, an overspray region 946 includes particles of dummy die material which are on a top surface of mold structure 954 (and outside of the recess structure which extends into mold structure 954. Alternatively or in addition, packaged device 1050 comprises one or more artifacts of a substractive process to form recess structure 853. By way of illustration and not limitation, in one such embodiment, region 934 shows a region wherein at least some of portion of mold structure 954 begins to extend under dummy die 940. In one such embodiment, mold structure 954 forms the bottom of recess structure 853 at least in part—e.g., wherein laser drilling did not extend so far as to expose some portions of surface 911.

Figure 10C:
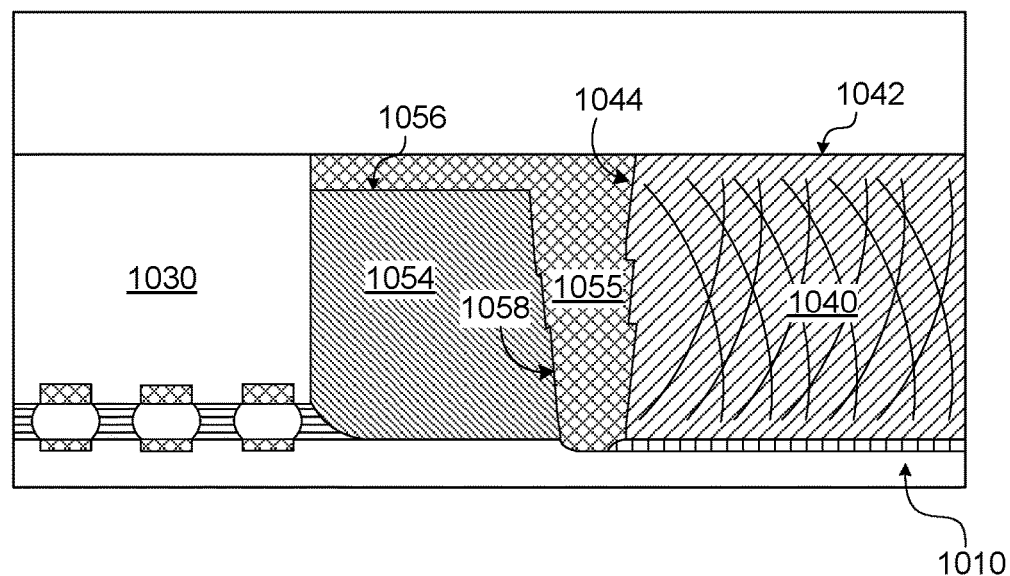

FIG. 10C illustrates a packaged device 1051 which includes dummy die structures according to another embodiment. In the example embodiment shown, packaged device 1051 includes one or more features of packaged device 1000—e.g., wherein a substrate 1010, an IC die 1030, a dummy die 1040, and mold structures 1054, 1055 of packaged device 1051 correspond functionally to substrate 810, IC die 830, dummy die 840, and mold structures 854, 855 (respectively).

Packaged device 1051 illustrates an embodiment wherein, at some point, a deposited dummy die material—e.g., that of a pre-formed dummy die structure—extends to or above a vertical (z-axis) height of IC die 1030. A second package mold material is subsequently deposited on mold structure 1054 (and, for example, in a region between mold structure 1054 and the dummy die material). Afterward, a grinding, polishing and/or other subtractive process is performed to remove some of the second package mold material (and, for example, some of the dummy die material). In various embodiments, such processing results in a dummy die 1040 extending past (e.g., through) mold structure 1055, wherein a top surface 1042 of dummy die 1040 forms a top side of packaged device 1051 at least in part. In one such embodiment, mold structure 1055 leaves a top side of IC die 1030 exposed (although some embodiments are not limited in this regard). Alternatively or in addition, mold structure 1055 adjoins a side surface 1044 of dummy die 1040—e.g., wherein a portion of mold structure 1055 extends between side surface 1044 and another side surface 1058 of mold structure 1054.

Figure 11:
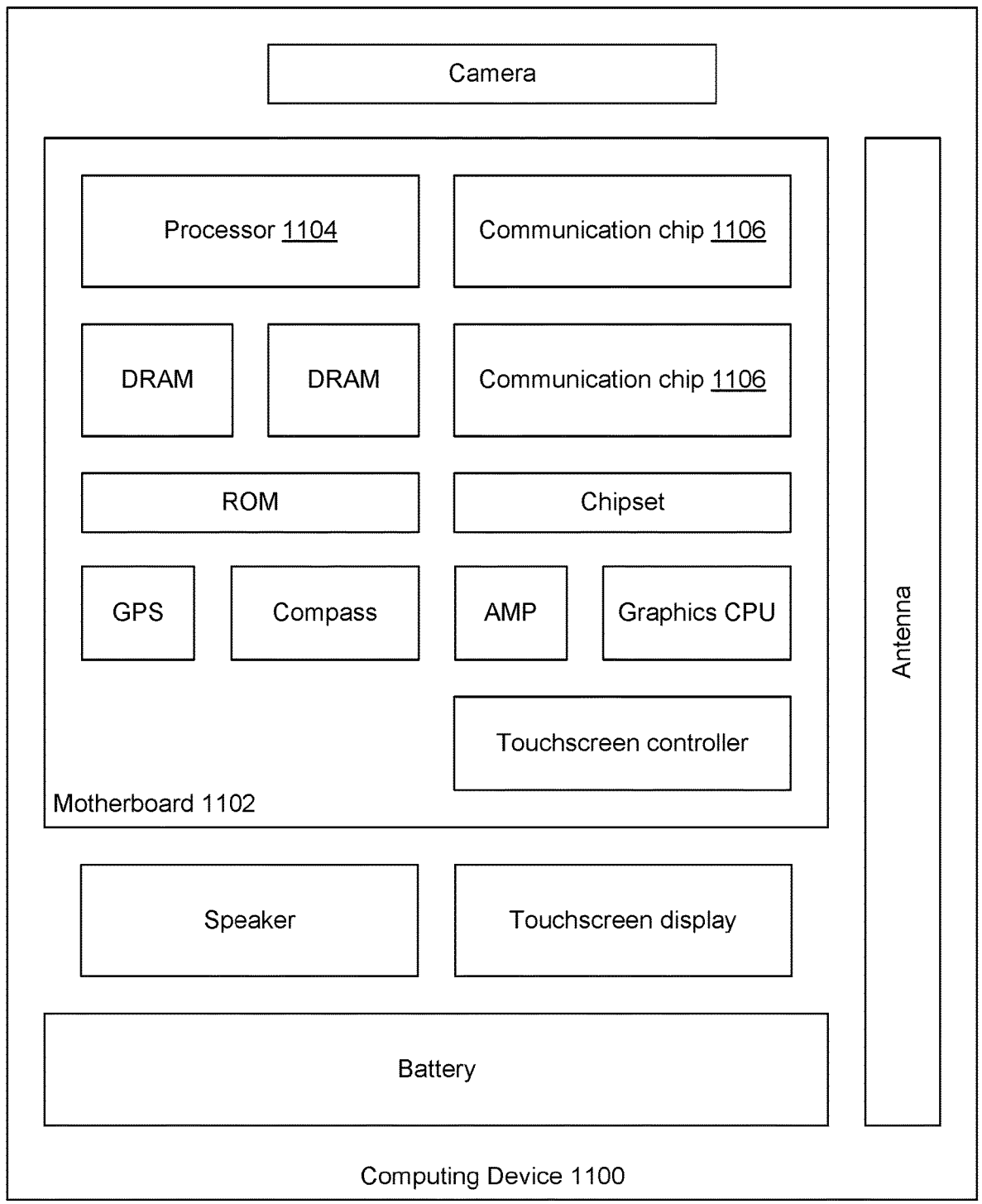
FIG. 11 is a functional block diagram illustrating a computing device in accordance with one embodiment.

FIG. 11 illustrates a computing device 1100 in accordance with one embodiment. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. The term "processor" may refer to any device or portion of a device that processes electronic data from registers and/or memory to transform that electronic data into other electronic data that may be stored in registers and/or memory. The communication chip 1106 also includes an integrated circuit die packaged within the communication chip 1106.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
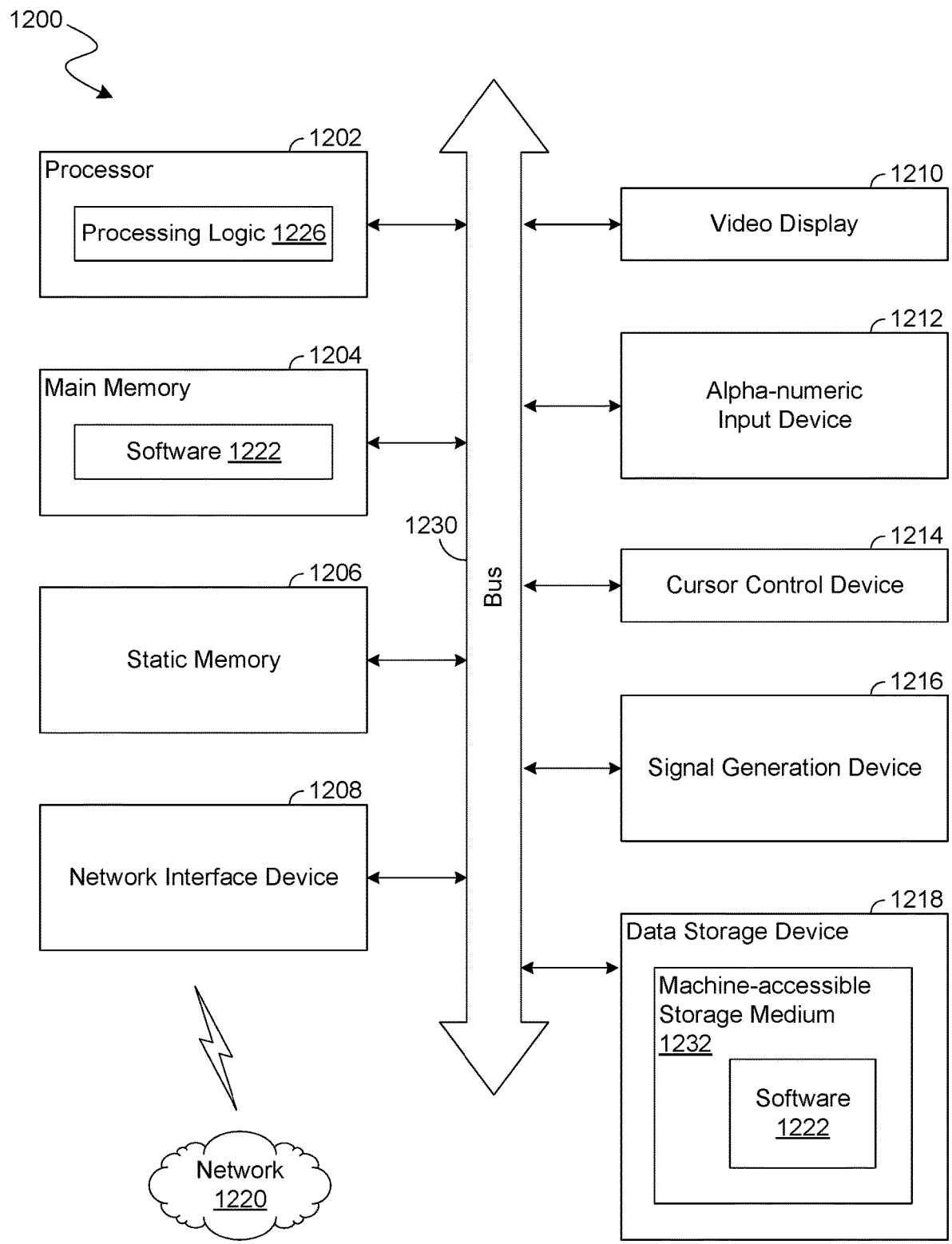
FIG. 12 is a functional block diagram illustrating an exemplary computer system, in accordance with one embodiment.

FIG. 12 illustrates a diagrammatic representation of a machine in the exemplary form of a computer system 1200 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 13:
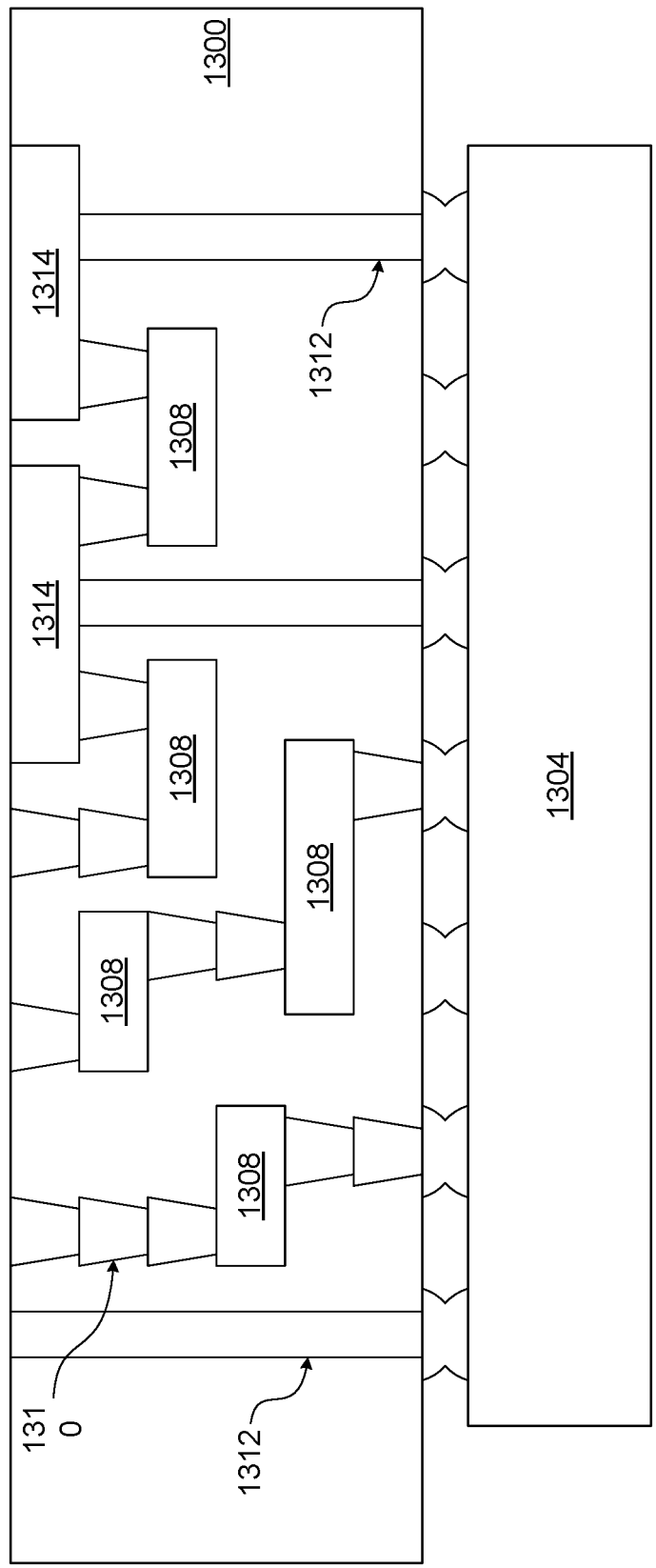
FIG. 13 is a cross-sectional view of an interposer implementing one or more embodiments.

FIG. 13 illustrates an interposer 1300 that includes one or more embodiments. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302, 1304 are attached to opposing sides of the interposer 1300. In other embodiments, the first and second substrates 1302, 1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with some embodiments, apparatuses or processes disclosed herein may be used in the fabrication of interposer 1300.

Example 1: A packaged device comprising: a substrate; an integrated circuit (IC) die coupled to a first region of the substrate; a dummy die structure adjacent to the IC die and coupled to a second region of the substrate, the dummy die structure comprising a polymer resin and a filler; and a package mold structure which adjoins respective sides of the IC die and the dummy die, and adjoins the surface of the substrate.

Example 2: The packaged device of example 1, wherein a coefficient of thermal expansion (CTE) of the filler is less than zero parts per million per degree Kelvin (ppm/° K).

Example 3: The packaged device of example 2, wherein the CTE of the filler is in a range of −6 parts per million per degree Kelvin (ppm/° K) to −9 ppm/° K.

Example 4: The packaged device of example 2, wherein a volume fraction of the filler in the dummy die structure is at least 70%.

Example 5: The packaged device of example 4, wherein the volume fraction is in a range of between 80% and 90%.

Example 6: The packaged device of example 2, wherein a first thermal conductivity of the dummy die structure is greater than a second thermal conductivity of the IC die.

Example 7: The packaged device of example 1, wherein: a first coefficient of thermal expansion (CTE) of the dummy die structure is less than a second CTE of the package mold structure; and a first thermal conductivity of the dummy die structure is greater than a second thermal conductivity of the package mold structure.

Example 8: The packaged device of example 1, wherein the filler comprises lithium aluminum silicate, the lithium aluminum silicate having a chemical composition of $Li_2O$—$Al_2O_3$-$nSiO_2$, and the n being a numerical value.

Example 9: The packaged device of example 1, wherein the filler comprises zirconium tungstate.

Example 10: The packaged device of example 1, wherein the dummy die structure extends to an edge of the substrate.

Example 11: A method comprising: coupling an integrated circuit (IC) die to a first region of a substrate; forming a dummy die structure on a second region of the substrate, wherein the dummy die structure is adjacent to the IC die, the dummy die structure comprising a polymer resin and a filler; and after forming the dummy die structure, forming a package mold structure which adjoins respective sides of the IC die and the dummy die, and adjoins the surface of the substrate.

Example 12: The method of example 11, wherein a coefficient of thermal expansion (CTE) of the filler is less than zero parts per million per degree Kelvin (ppm/° K).

Example 13: The method of example 12, wherein the CTE of the filler is in a range of −6 parts per million per degree Kelvin (ppm/° K) to −9 ppm/° K.

Example 14: The method of example 12, wherein a volume fraction of the filler in the dummy die structure is at least 70%.

Example 15: The method of example 14, wherein the volume fraction is in a range of between 80% and 90%.

Example 16: The method of example 12, wherein a first thermal conductivity of the dummy die structure is greater than a second thermal conductivity of the IC die.

Example 17: The method of example 11, wherein: a first coefficient of thermal expansion (CTE) of the dummy die structure is less than a second CTE of the package mold structure; and a first thermal conductivity of the dummy die structure is greater than a second thermal conductivity of the package mold structure.

Example 18: The method of example 11, wherein the filler comprises lithium aluminum silicate, the lithium aluminum silicate having a chemical composition of $Li_2O$—$Al_2O_3$-$nSiO_2$, and the n being a numerical value.

Example 19: The method of example 11, wherein the filler comprises zirconium tungstate.

Example 20: The method of example 11, wherein the dummy die structure extends to an edge of the substrate.

Example 21: A system comprising: a packaged device comprising: a substrate; an integrated circuit (IC) die coupled to a first region of the substrate; a dummy die structure adjacent to the IC die and coupled to a second region of the substrate, the dummy die structure comprising a polymer resin and a filler; and a package mold structure which adjoins respective sides of the IC die and the dummy die, and adjoins the surface of the substrate; and a display device coupled to the packaged device, the display device to display an image based on a signal communicated with the IC die.

Example 22: The system of example 21, wherein a coefficient of thermal expansion (CTE) of the filler is less than zero parts per million per degree Kelvin (ppm/° K).

Example 23: The system of example 22, wherein the CTE of the filler is in a range of −6 parts per million per degree Kelvin (ppm/° K) to −9 ppm/° K.

Example 24: The system of example 22, wherein a volume fraction of the filler in the dummy die structure is at least 70%.

Example 25: The system of example 24, wherein the volume fraction is in a range of between 80% and 90%.

Example 26: The system of example 22, wherein a first thermal conductivity of the dummy die structure is greater than a second thermal conductivity of the IC die.

Example 27: The system of example 21, wherein: a first coefficient of thermal expansion (CTE) of the dummy die structure is less than a second CTE of the package mold structure; and a first thermal conductivity of the dummy die structure is greater than a second thermal conductivity of the package mold structure.

Example 28: The system of example 21, wherein the filler comprises lithium aluminum silicate, the lithium aluminum silicate having a chemical composition of $Li_2O$—$Al_2O_3$-$nSiO_2$, and the n being a numerical value.

Example 29: The system of example 21, wherein the filler comprises zirconium tungstate.

Example 30: The system of example 21, wherein the dummy die structure extends to an edge of the substrate.

Example 31: A packaged device comprising: a substrate; an integrated circuit (IC) die coupled to a first region of the substrate; a first package mold structure adjacent to the IC die and coupled to a second region of the surface, wherein a recess structure is formed with the first package mold structure; a dummy die structure on a bottom of the recess structure, the dummy die structure comprising: a polymer resin and a filler; or a metal having a coefficient of thermal expansion (CTE) which is less than 12 parts per million per degree Kelvin (ppm/° K); and a second package mold structure adjacent to the first package mold structure and adjacent to the IC die, wherein the second package mold structure extends to the recess structure.

Example 32: The packaged device of example 31, wherein the dummy die structure comprises the polymer resin and the filler, and wherein a second CTE of the filler is less than zero ppm/° K.

Example 33: The packaged device of example 32, wherein the second CTE of the filler is in a range of −6 parts per million per degree Kelvin (ppm/° K) to −9 ppm/° K.

Example 34: The packaged device of example 32, wherein a volume fraction of the filler in the dummy die structure is at least 70%.

Example 35: The packaged device of example 34, wherein the volume fraction is in a range of between 80% and 90%.

Example 36: The packaged device of example 32, wherein a first thermal conductivity of the dummy die structure is greater than a second thermal conductivity of the IC die.

Example 37: The packaged device of example 31, wherein: a first coefficient of thermal expansion (CTE) of the dummy die structure is less than a second CTE of one of the first package mold structure or the second package mold structure; and a first thermal conductivity of the dummy die structure is greater than a second thermal conductivity of the one of the first package mold structure or the second package mold structure.

Example 38: The packaged device of example 31, wherein the dummy die structure comprises the polymer resin and the filler, and wherein the filler comprises lithium aluminum silicate, the lithium aluminum silicate having a chemical composition of $Li_2O—Al_2O_3\text{-}nSiO_2$, and the n being a numerical value.

Example 39: The packaged device of example 31, wherein the dummy die structure comprises the polymer resin and the filler, and wherein the filler comprises zirconium tungstate.

Example 40: The packaged device of example 31, wherein the dummy die structure comprises the metal, and wherein the metal comprises a nickel-iron alloy.

Example 41: A method comprising: coupling an integrated circuit (IC) die to a first region of a substrate; forming a first package mold structure on a second region of the substrate, wherein the first package mold structure is adjacent to the IC die; forming a recess structure which extends into the first package mold structure; forming a dummy die structure on a bottom of the recess structure, the dummy die structure comprising: a polymer resin and a filler; or a metal having a coefficient of thermal expansion (CTE) which is less than 12 parts per million per degree Kelvin (ppm/° K); and after forming the dummy die structure, forming a second package mold structure adjacent to the first package mold structure and adjacent to the IC die, wherein the second package mold structure extends to the recess structure.

Example 42: The method of example 41, wherein the dummy die structure comprises the polymer resin and the filler, and wherein a second CTE of the filler is less than zero ppm/° K.

Example 43: The method of example 42, wherein the second CTE of the filler is in a range of –6 parts per million per degree Kelvin (ppm/° K) to –9 ppm/° K.

Example 44: The method of example 42, wherein a volume fraction of the filler in the dummy die structure is at least 70%.

Example 45: The method of example 44, wherein the volume fraction is in a range of between 80% and 90%.

Example 46: The method of example 42, wherein a first thermal conductivity of the dummy die structure is greater than a second thermal conductivity of the IC die.

Example 47: The method of example 41, wherein: a first coefficient of thermal expansion (CTE) of the dummy die structure is less than a second CTE of one of the first package mold structure or the second package mold structure; and a first thermal conductivity of the dummy die structure is greater than a second thermal conductivity of the one of the first package mold structure or the second package mold structure.

Example 48: The method of example 41, wherein the dummy die structure comprises the polymer resin and the filler, and wherein the filler comprises lithium aluminum silicate, the lithium aluminum silicate having a chemical composition of $Li_2O—Al_2O_3\text{-}nSiO_2$, and the n being a numerical value.

Example 49: The method of example 41, wherein the dummy die structure comprises the polymer resin and the filler, and wherein the filler comprises zirconium tungstate.

Example 50: The method of example 41, wherein the dummy die structure comprises the metal, and wherein the metal comprises a nickel-iron alloy.

Example 51: A system comprising: a packaged device comprising: a substrate; an integrated circuit (IC) die coupled to a first region of the substrate; a first package mold structure adjacent to the IC die and coupled to a second region of the surface, wherein a recess structure is formed with the first package mold structure; a dummy die structure on a bottom of the recess structure, the dummy die structure comprising: a polymer resin and a filler; or a metal having a coefficient of thermal expansion (CTE) which is less than 12 parts per million per degree Kelvin (ppm/° K); and a second package mold structure adjacent to the first package mold structure and adjacent to the IC die, wherein the second package mold structure extends to the recess structure; and a display device coupled to the packaged device, the display device to display an image based on a signal communicated with the IC die.

Example 52: The system of example 51, wherein the dummy die structure comprises the polymer resin and the filler, and wherein a second CTE of the filler is less than zero ppm/° K.

Example 53: The system of example 52, wherein the second CTE of the filler is in a range of –6 parts per million per degree Kelvin (ppm/° K) to –9 ppm/° K.

Example 54: The system of example 52, wherein a volume fraction of the filler in the dummy die structure is at least 70%.

Example 55: The system of example 54, wherein the volume fraction is in a range of between 80% and 90%.

Example 56: The system of example 52, wherein a first thermal conductivity of the dummy die structure is greater than a second thermal conductivity of the IC die.

Example 57: The system of example 51, wherein: a first coefficient of thermal expansion (CTE) of the dummy die structure is less than a second CTE of one of the first package mold structure or the second package mold structure; and a first thermal conductivity of the dummy die structure is greater than a second thermal conductivity of the one of the first package mold structure or the second package mold structure.

Example 58: The system of example 51, wherein the dummy die structure comprises the polymer resin and the filler, and wherein the filler comprises lithium aluminum silicate, the lithium aluminum silicate having a chemical composition of $Li_2O—Al_2O_3\text{-}nSiO_2$, and the n being a numerical value.

Example 59: The system of example 51, wherein the dummy die structure comprises the polymer resin and the filler, and wherein the filler comprises zirconium tungstate.

Example 60: The system of example 51, wherein the dummy die structure comprises the metal, and wherein the metal comprises a nickel-iron alloy.

Techniques and architectures for improving heat conduction characteristics of a packaged IC device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
    a substrate comprising a surface;
    an integrated circuit (IC) die coupled to a first region of the surface;
    a dummy die structure coupled to the substrate at a second region of the surface, the dummy die structure comprising a polymer resin and a filler; and
    a package mold structure which adjoins respective sides of the IC die and the dummy die, wherein the package mold structure extends over and adjoins each of:
        respective top surfaces of the IC die and the dummy die structure; and
        the surface of the substrate;
    wherein:
        a first coefficient of thermal expansion (CTE) of the dummy die structure is less than a second CTE of the package mold structure; and
        a first thermal conductivity of the dummy die structure is greater than a second thermal conductivity of the package mold structure.

2. The packaged device of claim 1, wherein a coefficient of thermal expansion (CTE) of the filler is less than zero parts per million per degree Kelvin (ppm/° K).

3. The packaged device of claim 2, wherein the CTE of the filler is in a range of −6 parts per million per degree Kelvin (ppm/° K) to −9 ppm/° K.

4. The packaged device of claim 2, wherein a volume fraction of the filler in the dummy die structure is at least 70%.

5. The packaged device of claim 4, wherein the volume fraction is in a range of between 80% and 90%.

6. The packaged device of claim 2, wherein a first thermal conductivity of the dummy die structure is greater than a second thermal conductivity of the IC die.

7. The packaged device of claim 1, wherein the package mold structure surrounds the dummy die structure in a horizontal plane.

8. The packaged device of claim 1, wherein the filler comprises lithium aluminum silicate, the lithium aluminum silicate having a chemical composition of $Li_2O$—$Al_2O_3$-$nSiO_2$, and the n being a numerical value.

9. The packaged device of claim 1, wherein the filler comprises zirconium tungstate.

10. The packaged device of claim 1, wherein the dummy die structure extends to an edge of the substrate.

11. A system comprising:
    a packaged device comprising:
        a substrate comprising a surface;
        an integrated circuit (IC) die coupled to a first region of the surface;
        a dummy die structure coupled to the substrate at a second region of the surface, the dummy die structure comprising a polymer resin and a filler; and
        a package mold structure which adjoins respective sides of the IC die and the dummy die, wherein the package mold structure extends over and adjoins each of:
            respective top surfaces of the IC die and the dummy die structure; and
            the surface of the substrate;
        wherein:
            a first coefficient of thermal expansion (CTE) of the dummy die structure is less than a second CTE of the package mold structure; and
            a first thermal conductivity of the dummy die structure is greater than a second thermal conductivity of the package mold structure; and
    a display device coupled to the packaged device, the display device to display an image based on a signal communicated with the IC die.

12. The system of claim 11, wherein a coefficient of thermal expansion (CTE) of the filler is less than zero parts per million per degree Kelvin (ppm/° K).

13. The system of claim 12, wherein the CTE of the filler is in a range of −6 parts per million per degree Kelvin (ppm/° K) to −9 ppm/° K.

14. The system of claim 11, wherein the package mold structure surrounds the dummy die structure in a horizontal plane.

15. The system of claim 11, wherein the filler comprises lithium aluminum silicate, the lithium aluminum silicate having a chemical composition of $Li_2O$—$Al_2O_3$-$nSiO_2$, and the n being a numerical value.

* * * * *